(12) United States Patent
Mykland

(10) Patent No.: US 9,633,160 B2
(45) Date of Patent: Apr. 25, 2017

(54) METHOD OF PLACEMENT AND ROUTING IN A RECONFIGURATION OF A DYNAMICALLY RECONFIGURABLE PROCESSOR

(71) Applicant: Robert Keith Mykland, Capitola, CA (US)

(72) Inventor: Robert Keith Mykland, Capitola, CA (US)

( * ) Notice: Subject to any disclaimer, the term of this patent is extended or adjusted under 35 U.S.C. 154(b) by 115 days.

(21) Appl. No.: 13/832,005

(22) Filed: Mar. 15, 2013

(65) Prior Publication Data

US 2014/0122835 A1 May 1, 2014

Related U.S. Application Data

(63) Continuation-in-part of application No. 13/722,831, filed on Dec. 20, 2012, now Pat. No. 9,304,770, and a continuation-in-part of application No. 13/493,962, filed on Jun. 11, 2012, now Pat. No. 9,158,544.

(51) Int. Cl.
    *G06F 17/50* (2006.01)
(52) U.S. Cl.
    CPC ...... *G06F 17/5072* (2013.01); *G06F 17/5077* (2013.01)
(58) Field of Classification Search
    CPC ............... G06F 7/78; G06F 8/00–8/78; G06F 9/44–9/455; G06F 11/36
    USPC ................................................ 717/100–178
    See application file for complete search history.

(56) References Cited

U.S. PATENT DOCUMENTS

| | | | |
|---|---|---|---|
| 5,317,743 A | 5/1994 | Imai et al. | |
| 5,465,373 A * | 11/1995 | Kahle | G06F 9/384 712/215 |
| 5,488,707 A | 1/1996 | Phillips et al. | |
| 5,822,591 A | 10/1998 | Hochmuth | |
| 5,950,009 A | 9/1999 | Bortnikov et al. | |
| 5,966,536 A * | 10/1999 | Ravichandran | G06F 8/443 714/E11.192 |
| 5,974,538 A | 10/1999 | Wilmot, II | |
| 6,438,737 B1 | 8/2002 | Morelli et al. | |
| 6,717,436 B2 | 4/2004 | Kress et al. | |
| 6,832,370 B1 | 12/2004 | Srinivasan et al. | |
| 6,868,017 B2 | 3/2005 | Ikeda | |
| 6,907,592 B1 * | 6/2005 | Dante | H03K 19/17732 716/117 |
| 6,988,183 B1 | 1/2006 | Wong | |
| 7,076,575 B2 | 7/2006 | Baitinger et al. | |
| 7,155,602 B2 | 12/2006 | Poznanovic | |
| 7,167,976 B2 | 1/2007 | Poznanovic | |
| 7,171,659 B2 | 1/2007 | Becker et al. | |
| 7,840,777 B2 | 11/2010 | Mykland | |
| 7,840,950 B2 | 11/2010 | Stoodley et al. | |

(Continued)

OTHER PUBLICATIONS

Goldstein et al., PipeRench: A Reconfigurable Architecture and Compiler, 2000.*

(Continued)

*Primary Examiner* — H S Sough
*Assistant Examiner* — Zhan Chen
(74) *Attorney, Agent, or Firm* — Patrick Reilly

(57) ABSTRACT

A method and system are provided for deriving a resultant compiled software code with increased compatibility for placement and routing of a dynamically reconfigurable processor.

17 Claims, 20 Drawing Sheets

(56) References Cited

U.S. PATENT DOCUMENTS

| | | | |
|---|---|---|---|
| 7,930,668 B1* | 4/2011 | Parsa | G06F 17/5072 703/19 |
| 8,078,849 B2 | 12/2011 | Libby et al. | |
| 2003/0233595 A1* | 12/2003 | Charny et al. | 714/4 |
| 2004/0019765 A1 | 1/2004 | Klein, Jr. | |
| 2004/0068329 A1 | 4/2004 | Mykland | |
| 2004/0073899 A1 | 4/2004 | Luk et al. | |
| 2004/0088685 A1 | 5/2004 | Poznanovic et al. | |
| 2004/0107331 A1 | 6/2004 | Baxter | |
| 2005/0044195 A1* | 2/2005 | Westfall | H04L 49/101 709/223 |
| 2006/0004997 A1 | 1/2006 | Mykland | |
| 2006/0031600 A1 | 2/2006 | Ellis et al. | |
| 2006/0242385 A1 | 10/2006 | Murakami et al. | |
| 2006/0248317 A1* | 11/2006 | Vorbach et al. | 712/221 |
| 2007/0088537 A1* | 4/2007 | Lertora | G06F 15/7867 703/28 |
| 2007/0198971 A1* | 8/2007 | Dasu | G06F 8/433 717/140 |
| 2008/0005498 A1 | 1/2008 | Morena et al. | |
| 2008/0189703 A1 | 8/2008 | Im et al. | |
| 2009/0119490 A1* | 5/2009 | Oh | G06F 9/30065 712/214 |
| 2009/0119654 A1 | 5/2009 | Kawahito et al. | |
| 2009/0240928 A1 | 9/2009 | Fischer et al. | |
| 2009/0241083 A1* | 9/2009 | Olgiati et al. | 716/9 |
| 2010/0185839 A1* | 7/2010 | Oh et al. | 712/241 |
| 2011/0113411 A1 | 5/2011 | Yonezu | |
| 2012/0096444 A1 | 4/2012 | Wright et al. | |
| 2012/0331450 A1 | 12/2012 | Mykland | |

OTHER PUBLICATIONS

Carter, Using Dynamically Reconfigurable Hardware in Real-Time COmmunications Systems, 2001.*

U.S. Appl. No. 13/301,763, filed Nov. 2011, Mykland, R.K.

* cited by examiner

| RLU 304 | | | | | | | |
|---|---|---|---|---|---|---|---|
| 441 | 440 | 439 | 438 | 437 | 436 | 435 | 434 |
| 384 | 383 | 382 | 381 | 380 | 379 | 378 | 377 |
| 376 | 375 | 374 | 373 | 372 | 371 | 370 | 369 |
| 368 | 367 | 366 | 365 | 364 | 363 | 362 | 361 |
| 360 | 359 | 358 | 357 | 356 | 355 | 354 | 353 |
| 352 | 351 | 350 | 349 | 348 | 347 | 346 | 345 |
| 343 | 342 | 341 | 340 | 389 | 388 | 387 | 386 |
| 385 | 384 | 383 | 382 | 381 | 380 | 379 | 378 |
| 377 | 376 | 375 | 374 | 373 | 372 | 371 | 370 |
| 369 | 368 | 367 | 366 | 365 | 364 | 363 | 362 |
| 361 | 360 | 359 | 358 | 357 | 356 | 355 | 354 |
| 353 | 352 | 351 | 350 | 349 | 348 | 347 | 346 |
| 345 | 344 | 343 | 342 | 341 | 340 | 339 | 338 |
| 337 | 336 | 335 | 334 | 333 | 332 | 331 | 330 |
| 329 | 328 | 327 | 326 | 325 | 324 | 323 | 322 |
| 321 | 320 | 319 | 318 | 317 | 316 | 315 | 314 |

FIGURE 5

Cell place 0; inputs none; output x 44(+44); output y none;
Cell place 1; inputs none; output x 22(+21); output y none;
Cell place 2; inputs none; output x 32(+30); output y none;
Cell place 3; inputs none; output x 9(+6); output y none;
Cell place 4; inputs none; output x 10(+6); output y none;
Cell place 5; inputs none; output x 6(+1) 28(+23); output y none;
Cell place 6; inputs 5x(-1); output x 9(+3); output y none;
Cell place 7; inputs none; output x 8(+1) 29(+22); output y none;
Cell place 8; inputs 7x(-1); output x 10(+2); output y none;
Cell place 9; inputs 6x(-3) 3x(-6); output x 11(+2); output y none;
Cell place 10; inputs 8x(-2) 4x(-6); output x 11(+1) 13(+3); output y none;
Cell place 11; inputs 9x(-2) 10x(-1); output x 12(+1); output y none;
Cell place 12; inputs 11x(-1); output x none; output y none;
Cell place 13; inputs 10x(-3); output x 14(+1); output y none;
Cell place 14; inputs 13x(-1); output x none; output y none;
Cell place 15; inputs none; output x 16(+1) 44(+29); output y none;
Cell place 16; inputs 15x(-1); output x none; output y none;
Cell place 17; inputs none; output x 18(+1) 45(+28); output y none;
Cell place 18; inputs 17x(-1); output x none; output y none;
Cell place 19; inputs none; output x 20(+1); output y none;
Cell place 20; inputs 19x(-1); output x 21(+1) 22(+2); output y none;
Cell place 21; inputs 20x(-1); output x none; output y none;
Cell place 22; inputs 20x(-2) 1x(-21); output x 23(+1); output y none;
Cell place 23; inputs 22x(-1); output x none; output y none;
Cell place 24; inputs none; output x 25(+1); output y none;
Cell place 25; inputs 24x(-1); output x none; output y none;
Cell place 26; inputs none; output x 27(+1); output y none;
Cell place 27; inputs 26x(-1); output x none; output y none;
Cell place 28; inputs 5x(-23); output x 31(+3) 32(+4); output y none;
Cell place 29; inputs 7x(-22); output x 30(+1) 33(+4) 34(+5); output y none;
Cell place 30; inputs 29x(-1); output x none; output y none;
Cell place 31; inputs 28x(-3); output x none; output y none;
Cell place 32; inputs 28x(-4) 2x(-30); output x none; output y none;
Cell place 33; inputs 29x(-4); output x 34(+1); output y none;
Cell place 34; inputs 33x(-1) 29x(-5); output x 39(+5); output y none;
Cell place 35; inputs none; output x 40(+5); output y none;
Cell place 36; inputs none; output x 42(+6); output y none;
Cell place 37; inputs none; output x 40(+3); output y none;
Cell place 38; inputs none; output x 42(+4); output y none;
Cell place 39; inputs 34x(-5); output x 40(+1) 42(+3); output y none;
Cell place 40; inputs 39x(-1) 37x(-3) 35x(-5); output x 41(+1); output y none;
Cell place 41; inputs 40x(-1); output x none; output y none;
Cell place 42; inputs 39x(-3) 38x(-4) 36x(-6); output x 43(+1); output y none;
Cell place 43; inputs 42x(-1); output x none; output y none;
Cell place 44; inputs 15x(-29) 0x(-44); output x 47(+3); output y none;
Cell place 45; inputs 17x(-28); output x 46(+1); output y none;
Cell place 46; inputs 45x(-1); output x none; output y none;
Cell place 47; inputs 44x(-3); output x none; output y none;
Cell place 48; inputs none; output x 49(+1); output y none;
Cell place 49; inputs 48x(-1); output x none; output y none;
Cell place 50; inputs none; output x 51(+1); output y none;
Cell place 51; inputs 50x(-1); output x none; output y none;

ASC-007 FIGURE 10: New cell listing before

Cell place 0; inputs none; output x 24(+24); output y none;
Cell place 1; inputs none; output x 21(+20); output y none;
Cell place 2; inputs none; output x 10(+8); output y none;
Cell place 3; inputs none; output x 9(+6); output y none;
Cell place 4; inputs none; output x 10(+6); output y none;
Cell place 5; inputs none; output x 6(+1) 6(+1); output y none;
Cell place 6; inputs 5x(-1) 5x(-1); output x 9(+3); output y 30(+24);
Cell place 7; inputs none; output x 8(+1) 31(+24); output y none;
Cell place 8; inputs 7x(-1); output x 10(+2); output y none;
Cell place 9; inputs 6x(-3) 3x(-6); output x 11(+2); output y none;
Cell place 10; inputs 2x(-8) 8x(-2) 4x(-6); output x 11(+1) 13(+3); output y 34(+24);
Cell place 11; inputs 9x(-2) 10x(-1); output x 12(+1); output y none;
Cell place 12; inputs 11x(-1); output x none; output y none;
Cell place 13; inputs 10x(-3); output x 14(+1); output y none;
Cell place 14; inputs 13x(-1); output x none; output y none;
Cell place 15; inputs none; output x 16(+1) 22(+7); output y none;
Cell place 16; inputs 15x(-1); output x none; output y none;
Cell place 17; inputs none; output x 18(+1) 23(+6); output y none;
Cell place 18; inputs 17x(-1); output x none; output y none;
Cell place 19; inputs none; output x 20(+1); output y none;
Cell place 20; inputs 19x(-1); output x 21(+1) 22(+2); output y none;
Cell place 21; inputs 1x(-20) 20x(-1); output x 22(+1); output y none;
Cell place 22; inputs 15x(-7) 20x(-2) 21x(-1); output x 23(+1); output y none;
Cell place 23; inputs 17x(-6) 22x(-1); output x 47(+24); output y none;
Cell place 24; inputs 0x(-24); output x 25(+1); output y 46(+22);
Cell place 25; inputs 24x(-1); output x none; output y none;

Cell place 26; inputs none; output y 27(+1); output y none;
Cell place 27; inputs 26x(-1); output x none; output y none;
Cell place 28; inputs none; output x none; output y none;
Cell place 29; inputs none; output x none; output y none;
Cell place 30; inputs 6y(-24); output x 33(+3) 34(+4); output y none;
Cell place 31; inputs 7x(-24); output x 32(+1) 35(+4) 36(+5); output y none;
Cell place 32; inputs 31x(-1); output x none; output y none;
Cell place 33; inputs 30x(-3); output x none; output y none;
Cell place 34; inputs 30x(-4) 10y(-24); output x none; output y none;
Cell place 35; inputs 31x(-4); output x 36(+1); output y none;
Cell place 36; inputs 35x(-1) 31x(-5); output x 41(+5); output y none;
Cell place 37; inputs none; output x 42(+5); output y none;
Cell place 38; inputs none; output x 44(+6); output y none;
Cell place 39; inputs none; output x 42(+3); output y none;
Cell place 40; inputs none; output x 44(+4); output y none;
Cell place 41; inputs 36x(-5); output x 42(+1) 44(+3); output y none;
Cell place 42; inputs 41x(-1) 39x(-3) 37x(-5); output x 43(+1); output y none;
Cell place 43; inputs 42x(-1); output x none; output y none;
Cell place 44; inputs 41x(-3) 40x(-4) 38x(-6); output x 45(+1); output y none;
Cell place 45; inputs 44x(-1); output x none; output y none;
Cell place 46; inputs 22y(-24) 24y(-22); output x 49(+3); output y none;
Cell place 47; inputs 23x(-24); output x 48(+1); output y none;
Cell place 48; inputs 47x(-1); output x none; output y none;
Cell place 49; inputs 46x(-3); output x none; output y none;
Cell place 50; inputs none; output x 51(+1); output y none;
Cell place 51; inputs 50x(-1); output x none; output y none;
Cell place 52; inputs none; output x 53(+1); output y none;
Cell place 53; inputs 52x(-1); output x none; output y none;

ASC-007 FIGURE 11: Cell listing after compilation

METHOD OF PLACEMENT AND ROUTING IN A RECONFIGURATION OF A DYNAMICALLY RECONFIGURABLE PROCESSOR

CO-PENDING PATENT APPLICATIONS

This Nonprovisional patent application is a Continuation-in-Part Application to Nonprovisional patent application Ser. No. 13/722,831 filed on Dec. 20, 2012 by inventor Robert Mykland and titled "METHOD AND SYSTEM ADAPTED FOR CONVERTING SOFTWARE CONSTRUCTS INTO RESOURCES FOR IMPLEMENTATION BY A DYNAMICALLY RECONFIGURABLE PROCESSOR". Nonprovisional patent application Ser. No. 13/722,831 is hereby incorporated by reference in its entirety and for all purposes, to include claiming benefit of the priority date of filing of Nonprovisional patent application Ser. No. 13/722,831.

This Nonprovisional patent application is additionally a Continuation-in-Part application to Nonprovisional patent application Ser. No. 13/493,962, filed on Jun. 11, 2012 by inventor Robert Mykland and titled "SYSTEM AND METHOD FOR PERFORMING A BRANCH OBJECT CONVERSION TO PROGRAM CONFIGURABLE LOGIC CIRCUITRY". Nonprovisional patent application Ser. No. 13/493,962 is hereby incorporated by reference in its entirety and for all purposes, to include claiming benefit of the priority date of filing of Nonprovisional patent application Ser. No. 13/493,962.

This Nonprovisional patent application is yet additionally a Continuation-in-Part Application to Nonprovisional patent application Ser. No. 13/301,763, filed on Nov. 21, 2011 by inventor Robert Mykland and titled "CONFIGURABLE CIRCUIT ARRAY". Nonprovisional patent application Ser. No. 13/301,763 is hereby incorporated by reference in its entirety and for all purposes, to include claiming benefit of the priority date of filing of Nonprovisional patent application Ser. No. 13/301,763.

In addition, this Nonprovisional patent application is also a Continuation-in-Part Application to Nonprovisional patent application Ser. No. 13/360,805, filed on Jan. 30, 2012 by inventor Robert Mykland and titled "SYSTEM AND METHOD FOR COMPILING MACHINE-EXECUTABLE CODE GENERATED FROM A SEQUENTIALLY ORDERED PLURALITY OF PROCESSOR INSTRUCTIONS". Nonprovisional patent application Ser. No. 13/360,805 is hereby incorporated by reference in its entirety and for all purposes, to include claiming benefit of the priority date of filing of Nonprovisional patent application Ser. No. 13/360,805.

Furthermore, this Nonprovisional patent application is a Continuation-in-Part Application to Nonprovisional patent application Ser. No. 13/429,198, filed on Mar. 23, 2012 by inventor Robert Mykland and titled "SYSTEM AND METHOD FOR APPLYING A SEQUENCE OF OPERATIONS CODE TO PROGRAM CONFIGURABLE LOGIC CIRCUITRY". Nonprovisional patent application Ser. No. 13/429,198 is hereby incorporated by reference in its entirety and for all purposes, to include claiming benefit of the priority date of filing of Nonprovisional patent application Ser. No. 13/429,198.

FIELD OF THE INVENTION

The present invention relates to software, data processing and information technology. More particularly, the present invention relates to methods of, and systems for, generating software code for execution by a dynamically reconfigurable processor

BACKGROUND OF THE INVENTION

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

Prior art computers based on the design innovations of Turing and von Neumann currently dominate the field of general purpose computing. Yet this brilliant and fundamental design work was originally done with several now anachronistic constraints. The Turing and von Neumann computer architectures were also driven by a criterion of defining a simplest computer design that could therefore be reliable given the manufacturing technology available in the early 1940's. While electronics technology has dramatically evolved in the ensuing decades to empower the commercially feasible manufacture of increasingly more powerful logic circuits and more complex data processing systems, the prior art of computational system design has remained fixated upon complying with the design concepts and constraints selected by Turing and von Neumann that were established under the technological limitations and military necessities existent during the Second World War.

The Applicant has disclosed a radically new approach to the design of computational systems in both U.S. Pat. No. 7,840,777 and U.S. patent application Ser. No. 13/301,763 that each embody an inventive concept of computational design that is a novel and non-obvious departure from prior art computer design. In one singularly novel quality of the method of the present invention, the configurable circuit array of U.S. patent application Ser. No. 13/301,763 enables the automatic application of the entire command set of certain high level languages to automatically configure logic circuitry to computationally efficiently instantiate the logic of the originating high level source code without human operator intervention. More specifically, the method of the present invention enables the automated application of the higher level programming languages of FORTRAN, C, the Gnu C Complier ("GCC"), C++, JAVA and other suitable software languages known in the art by means of configurable logic and thereby instantiate logic of source code software programs written in each of these languages into a logic circuit configuration.

In prior art computers, the input to the prior art computer is a sequential series of instructions that is selected from a limited instruction set. In contrast, the method of the present invention (hereinafter, "the invented method") discloses that a dynamically reconfigurable processor, to include the apparatus of the present invention (hereinafter, "invented processor") need not have such an instruction set, but rather may execute a series of complex instructions that are applied to dynamically reconfigure a target circuit on the fly. The method of the present invention provides a compiler (hereinafter, "invented compiler") that extracts the logic, values, parameters, information and interrelationships of a sequence of instructions to efficiently configure a series of reconfigurable circuits coupled with input/output ("I/O") operations and memory operations. The invented compiler thereby accepts and automatically converts the logical flow of an arbitrarily long series of high level language instructions into an arbitrarily long sequence of reconfigurations of an array of reconfigurable circuits coupled with I/O and memory operations in order to functionally and practically perform a wide range of general purpose computing processes.

The prior art additionally includes reconfigurable logic circuitry that can be configured or reconfigured to at least partially implement data processing methods in accordance with a software program or software coded instructions. The prior art further provides software programs that consist of sequences of machine-executable commands that are organized as ordered lists of instructions that may be executed by a conventional, general purpose computer and that may allow for and include logical branching. However the use of software designed to be sequentially executed line-by-line by one or more central processor or arithmetic logic units may not allow for a more efficient operation possible by the special class of computational devices that may be configured, programmed and/or executed at least partly with parallel logic processing techniques. Furthermore, prior techniques of assigning computational circuitry, e.g., electronic circuitry, of an information technology system to support the implementation of a software program are dependent upon the nature of the hardware design of the information technology system.

There is therefore a long-felt need to provide methods and systems that enable a more efficient mapping of originating software coded information, to include but not limited to instructions, onto assignable and functionality appropriate types of logic circuits, such as electronic components of a dynamically reconfigurable processor. It is an additional object of the method of the present invention to provide a process that automatically derives software constructs that may be applied to dynamically reconfigure the reconfigurable elements and aspects of a dynamically reconfigurable processor.

SUMMARY AND OBJECTS OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

It is an object of the method of the present invention (hereinafter "invented method") to provide a method and a system that includes or provides a software compiler (hereinafter, "the invented compiler") that performs a placement and routing of software encoded representations of hardware components and cell elements of a dynamically reconfigurable processor in view of a software model of the dynamically reconfigurable processor for the correlation of aspects of the software model with the software encoded representations of hardware components and cell elements. The invented method thereby derives and/or generates at least partially compiled software automatically that is better structured for implementation as or within instructions executable by a dynamically reconfigurable processor. The invented method thereby thereby provides compiled software code that is intended to be (a.) executable by a dynamically reconfigurable processor, and/or (b.) prepared for any necessary further modification or structuring to enable execution by a dynamically reconfigurable processor.

Towards these objects and other objects that will be made obvious in light of this disclosure, a first preferred embodiment of the invented method provides a process that enables a prior art computational device or a dynamically reconfigurable processor to generate compiled software code from one or more groupings of distinguishable software coded collection of information relevant to the programming and configuration of a dynamically reconfigurable processor, to include (a.) configuration information, (b.) data to be processed, (c.) software resources, (d.) software cells; and/or optionally (e.) additional software encoded models of aspects of a dynamically reconfigurable processor, wherein such aspects may be related to or represent assignable hardware components and logic elements. Preferably each assignable component is distinguishable by types of functionality, capability and/or structure.

The invented method provides or applies a software model of hardware aspects of a dynamically reconfigurable processor and uses the software model to preferably automatically compile software code, wherein the resulting compiled software code is improved in structure to more efficiently implement a generation of software instructions that may be executed by a dynamically reconfigurable processor.

It is an optional and preferred object of the invented method to derive compiled software code from software encoded information as required for the compiled software to more closely instantiate or provide, or be further processed into, one or more instructions or instruction parts that are executable by a dynamically reconfigurable processor.

Certain still alternate preferred embodiments of the invented method alternately or additionally provide computer-implemented selection of a software operation and the association of one or more software models corresponding to one or more digital hardware elements of a dynamically reconfigurable processor with the selected software operation, wherein the digital hardware elements that correspond to the associated software models are capable of instantiating or embodying the logic and functionality of the selected software operation.

It is understood that the scope of definition of the term "software construct" of the present disclosure includes a software coded logical statement or instruction that may include (a.) an instruction such as an opcode, a command, machine-executable instruction; (b.) a null instruction, i.e., an instruction to not perform an operation, e.g. a no-op opcode; (c.) a datum or data; (d.) a variable; (e.) references to additional commands, data and variables; and/or other or additional opcode, mathematical expression or logic algorithm that may be expressed or represented in software in a form that is executable by a computer or from which a machine-executable instruction can be derived, determined or compiled.

The invented processor includes a plurality of electronic elements at least some of which may be assignable and reassignable in accordance with a software construct or software coded information. Alternatively, one or more elements or components of the processor may be distinguishable by functionality, capability and/or structure. The processor further comprises an input circuitry that accepts and/or stores a plurality of software coded constructs, instructions, data and/or information.

Additionally or alternately, the invented system may include, and/or the invented method may provide and may be employable by, a reprogrammable logic unit in whole or in part as disclosed in U.S. Pat. No. 7,840,777 issued on Nov. 23, 2010 to inventor Robert Mykland and titled "Method and apparatus for directing a computational array to execute a plurality of successive computational array instructions at runtime" and a method of programming thereof.

Still additionally or alternately, the invented method optionally provides a reprogrammable logic unit as disclosed in U.S. Nonprovisional patent application Ser. No. 13/301,763 filed on Nov. 21, 2011 to inventor Robert Mykland and titled "CONFIGURABLE CIRCUIT ARRAY" and a method of programming thereof.

DEFINITION OF CERTAIN TERMS

Certain new and special terms are used in the present disclosure and claims in describing various aspects of the invented method and invented processor, wherein these terms include the following:

An instruction is an encoded data that contains configuration information and optionally includes data to be processed by the same dynamically reconfigurable processor to which the configuration information is applied, wherein the configuration information may be applied by a dynamically reconfigurable processor to configure and/or reconfigure itself and accordingly process other data, and wherein the other data is (a.) currently existent in the processor and/or (b.) provided in a same instruction that contains the configuration information.

A dynamically reconfigurable processor is a digital computing system, such as the dynamically reconfigurable processor disclosed in U.S. Pat. No. 7,840,777, that applies an indefinitely long sequence of instructions to configure and/or reconfigure and thereupon process information.

The term component is defined herein to include any separately assignable digital circuit of a dynamically reconfigurable processor. Components of dynamically reconfigurable processors include suitable digital circuits and elements known in the art, to include cones, muxes, iterators, look up tables and logic gates as disclosed in U.S. Pat. No. 7,840,777.

A logic element is a digital circuit of a dynamically reconfigurable processor that comprises one or more components. Dynamically reconfigurable processors, such as the dynamically reconfigurable processor disclosed in U.S. Pat. No. 7,840,777, preferably contain a plurality of logic elements that are each formed with a same combination of components. The inclusion of a plurality of homogeneous logic elements in the invented processor is a preferred optional aspect of the invented method that generally increases the efficiency of the invented method. A logic element may include one or more cones, muxes, iterators, and logic gates as disclosed in U.S. Pat. No. 7,840,777 and/or one or more suitable digital circuits and elements known in the art. It is understood that not all components of a dynamically reconfigurable processor are part of a logic element.

A software resource, or "resource", is a software construct that mathematically models and represents a component or an aspect of a component of a dynamically reconfigurable processor. A resource may include configuration information and/or other information pertinent to the function, assignment, configuration and/or reconfiguration of the component. More specifically, a resource may be a generic resource identified by digital type, structure and/or function (b.) be associated with a specific component or aspect of a component, for example a specific input to an uniquely identified iterator of an individually identified logic element of a dynamically reconfigurable processor. Various resources may be or include mathematical models of the structure and functionality of, but not limited to, an iterator, cone, mux as disclosed in U.S. Pat. No. 7,840,777.

A resource bundle (hereinafter, "bundle") is one or more software resources that each model a component of the dynamically reconfigurable processor, whereby one or more components that can instantiate the logic and functionality of a software construct can be identified by type and can be represented as one or more resources that are specified by, or included in, a bundle. More particularly, a bundle may include one or more software resources that model the structure and functionality of one or more hardware components and/or logic elements of the dynamically reconfigurable processor.

A software cell (hereinafter, "cell") is a software construct that mathematically models and represents a logic element of a dynamically reconfigurable processor. A cell can contain pertinent resources associated with components of a relevant logic element or type of logic element. The cell may also contain configuration or other data pertinent to a particular logic element or logic element structure or type. As with resources, a cell can be either (a.) generic and identify a type of logic element or logic element structure; or (b.) specify a single and uniquely identified logic element of a dynamically reconfigurable processor.

A bubble is a software coded model that comprises a software coded collection of configuration information, data to be processed, resources, cells and optionally additional models of aspects of a reconfigurable processor. Bubbles are applied to generate potential instructions that may be developed into applied instructions. More particularly, a bubble is a mathematical model that preferably includes (a.) a plurality of software constructs that contain configuration information and optionally data to be processed; and (b.) resources and cells that mathematically model aspects, components and logic elements of the dynamically reconfigurable processor that would be required for, and enable, the dynamically reconfigurable processor to apply the configuration information and process the data in accordance with the configuration instruction. A bubble may thus be used to form a potential instruction and to determine if a potential instruction (a.) can be implemented by the dynamically reconfigurable processor; and/or (b.) shall be limited in size or content in order to be applicable by the dynamically reconfigurable processor. A bubble may also be applied to determine, estimate or forecast the efficiency of the dynamically reconfigurable processor in implementing an instruction or a potential instruction.

A data flow model is a software construct that organizes logical and mathematical operations, comprising but not limited to software opcodes and hardware circuits. Each input to each referenced or included operation may be linked back to a source of the related, included or referenced operation and input sources of each operation, and each output of each referenced or included operation may be or is linked to where the output is used in subsequent or dependent operations or calculations.

The scope of meaning of the term "to rip up" as intended in the present includes the general understanding of this term in the art as applied in modified notional assignments of aspects and connections of a representation of electronic hardware circuitry. More particularly, the meaning of the wording "rip up" is used, as in the art, to describe a process of unassigning a virtual software structure in order to derive an alternate foregoing representation of placement and routing with a reconfigurable or reprogrammable circuit.

INCORPORATION BY REFERENCE

All publications mentioned herein are incorporated herein by reference to disclose and describe the methods and/or materials in connection with which the publications are cited. All publications, patents, and patent applications mentioned in this specification are herein incorporated by reference in their entirety and for all purposes to the same extent as if each individual publication, patent, or patent application was specifically and individually indicated to be incorporated by reference.

In addition, each and all publications, patents, and patent applications mentioned in this specification are herein incorporated by reference to the same extent in their entirety and for all purposes as if each individual publication, patent, or patent application was specifically and individually indicated to be incorporated by reference. The publications discussed or mentioned herein are provided solely for their disclosure prior to the filing date of the present application. Nothing herein is to be construed as an admission that the present invention is not entitled to antedate such publication by virtue of prior invention. Furthermore, the dates of publication provided herein may differ from the actual publication dates which may need to be independently confirmed.

BRIEF DESCRIPTION OF THE FIGURES

These, and further features of the invention, may be better understood with reference to the accompanying specification and drawings depicting the preferred embodiment, in which:

FIG. 5 is a functional block diagram of the layout of the homogeneous logic elements of the reconfigurable logic unit of FIGS. 3 and 4;

FIG. 10 is an exemplary initial cell listing comprising placement and routing information prior to compilation by the invented method; and FIG. 11 is an exemplary listing of a resultant cell listing derived in a compilation by the invented compiler of the initial cell listing of FIG. 10 wherein an improved placement and routing pattern of the reconfigurable logic unit of FIGS. 3 and 4 is generated.

DETAILED DESCRIPTION

It is to be understood that this invention is not limited to particular aspects of the present invention described, as such may, of course, vary. It is also to be understood that the terminology used herein is for the purpose of describing particular aspects only, and is not intended to be limiting, since the scope of the present invention will be limited only by the appended claims.

Methods recited herein may be carried out in any order of the recited events which is logically possible, as well as the recited order of events.

Where a range of values is provided herein, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, the methods and materials are now described.

It must be noted that as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

Figure 1:
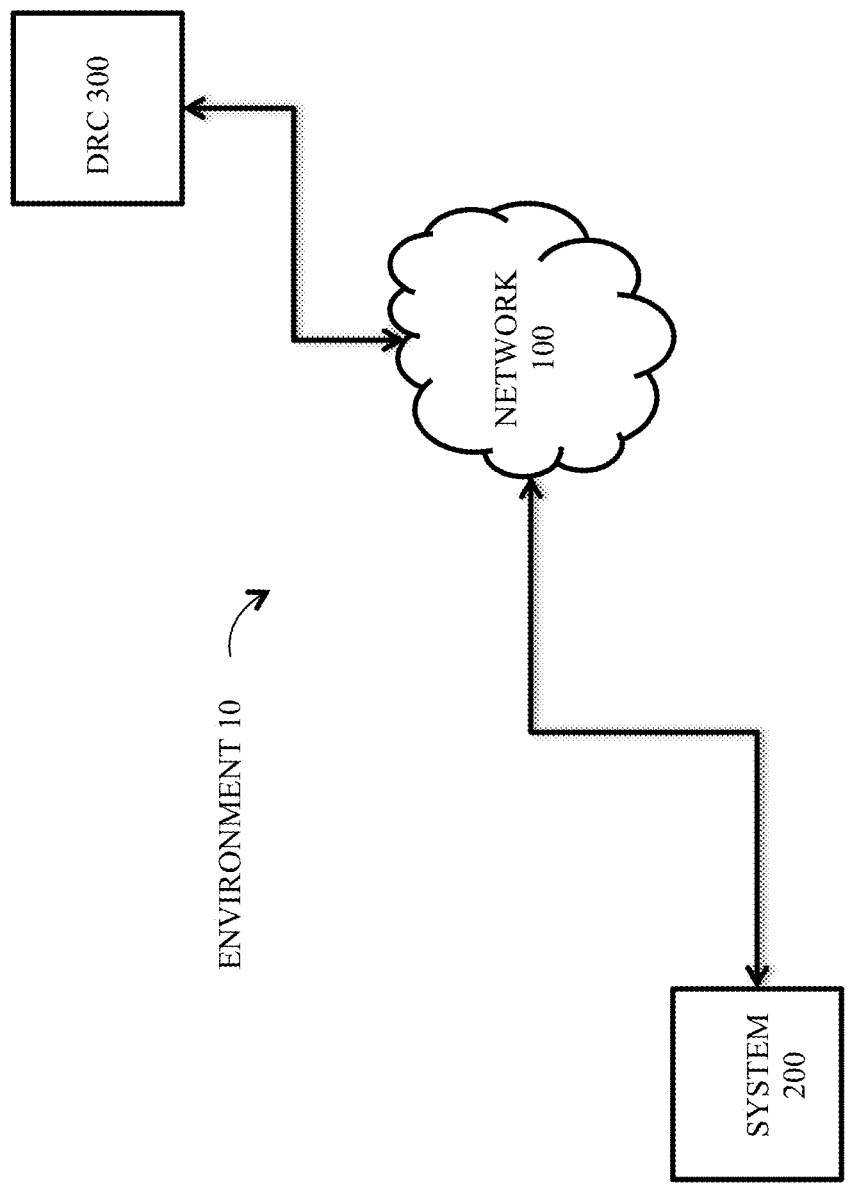
FIG. 1 is schematic of a computing environment that includes an electronic communications network that includes and bi-directionally communicatively couples a prior von Neumann computer and a dynamically reconfigurable computer.

Referring to FIG. 1, FIG. 1 presents an example of a suitable computing environment 10 in which embodiments utilizing the techniques described herein may be implemented. The computing environment 10 illustrated in FIG. 1 is only one example of a suitable computing environment and is not intended to suggest any limitation as to the scope of use or functionality of the techniques described herein in connection with compiling software suitable for execution by dynamically reconfigurable processors.

The techniques set forth herein may be described in the general context of computer-executable instructions, such as program modules, executed by one or more computers or other devices. Generally, program modules include routines, programs, objects, components, data structures, and the like, that perform particular tasks or implement particular abstract data types. Typically the functionality of the program modules may be combined or distributed as desired in various embodiments. Those skilled in the art will appreciate that the techniques described herein may be suitable for use with other general purpose and specialized purpose computing environments and configurations. Examples of well known computing systems, environments, and/or configurations include, but are not limited to, personal computers, server computers, hand-held or laptop devices, multiprocessor systems, microprocessor-based systems, programmable consumer electronics, network personal computers, minicomputers, mainframe computers, distributed computing environments that include any of the above systems or devices, and the like.

Included in example environment 10 of FIG. 1 are a network 100, a von Neumann style computational system 200 and a dynamically reconfigurable processor 300 (hereinafter, "DRC" 300). The network 100 may be or comprise the Internet, one or more telephony networks and/or one or more digital communications or computer networks. The system 200 may be, for example, a prior art computer, such as a personal computer, having a display output device and an input device providing for interactive I/O with a user thereof. In following paragraphs, additional details are provided with respect to the system 200. However, the same details may also apply to one or more other devices that may be connected to the network 100 in an embodiment. Although the example 10 of FIG. 1 presents the system 100 and the DRC 300 as only a single device, an embodiment utilizing the techniques herein may include any number of devices and other components.

The computational system 200 (hereinafter, "system" 200) included in FIG. 1 is exemplary for purposes of illustrating the techniques described herein in connection with software components. In one embodiment, any system 200 providing the functionality described herein may be included in an embodiment. The system 200 may include a processor used to execute code included in one or more program modules. Described in more detail elsewhere herein are program modules that may be executed by the system 200 in connection with the techniques described herein. The system 200 may operate in a networked environment and communicate with other computers or components not shown in FIG. 1. As described herein, the system 200 may be a personal computer. In other embodiments, the functionality of system 200, or the system 200 itself, may be included in another component in accordance with a particular environment in which the system 200 is utilized.

It will be appreciated by those skilled in the art that although the system 200 is shown in the example as communicating in the exemplary networked environment 10, the system 200 may communicate with other components utilizing different communication mediums. For example, the system 200 may communicate with one or more components utilizing a network connection, and/or other type of link known in the art including, but not limited to, the Internet, an intranet, or other wireless and/or hardwired connection(s) to the network and/or other components.

It should be noted that although the system 200 is illustrated as having network connectivity, the techniques described herein may be used in connection with a device or system operating standalone without such connectivity.

Figure 2:
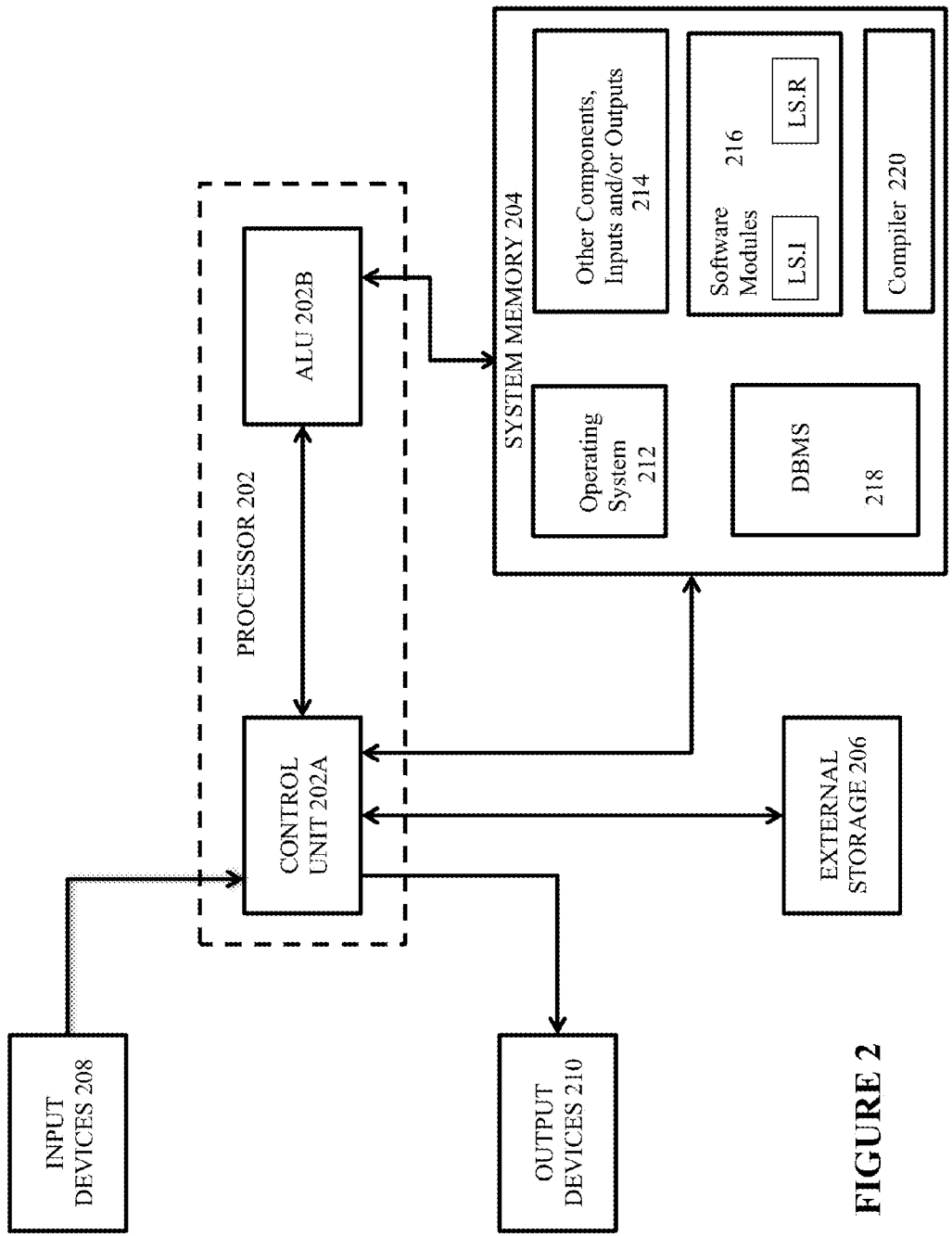
FIG. 2 is a functional block diagram of Neumann computer of FIG. 1 and presents central processor unit communicatively coupled with a system memory, a main memory, a network interface, one or more input modules and one or more output modules.

Referring to FIG. 2, shown is an example of components that may be included in the system 200 as may be used in connection with performing the various embodiments of the techniques described herein. The system 200 may include one or more central processing units 202 (hereinafter, "processor" 202), system memories 204, external storage memories 206, input devices 208, and output devices 210. One or more processor 202 may comprise a control unit 202A and an arithmetic logic unit 202B.

Depending on the configuration and type of system 200, system memory 204 and/or may be volatile (such as RAM), non-volatile (such as ROM, flash memory, etc.) or some combination of the two. Additionally, the system 200 may also have additional features/functionality. For example, the system 200 may also include additional storage (removable and/or non-removable) including, but not limited to, USB devices, magnetic or optical disks, or tape. Such additional storage is illustrated in FIG. 2 by external storage memory 206. The external storage memory 206 of FIG. 2 may include one or more removable and non-removable storage devices having associated computer-readable media that may be utilized by the system 200. The external storage memory 206 in one embodiment may be a mass-storage device with associated computer-readable media providing non-volatile storage for the system 200. Although the description of computer-readable media as illustrated in this example may refer to a mass storage device, such as a hard disk or CD-ROM drive, it will be appreciated by those skilled in the art that the computer-readable media may be any available media that can be accessed by the system 200.

By way of example, and not limitation, computer readable media may comprise computer storage media and communication media. System memory 204, as well as external storage memory 206, are examples of computer storage media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, (DVD) or other optical storage, magnetic cassettes, magnetic tape, magnetic disk storage or other magnetic storage devices, or any other medium which can be used to store the desired information and which can be accessed by system 200.

The system 200 may also contain communications connection(s) that allow the computer to communicate with other devices and components such as, by way of example, input devices and output devices.

In one embodiment, the system 200 may operate in a networked environment as illustrated in FIG. 1 using logical connections to remote computers through a network. The system 200 may connect to the network 100 of FIG. 1 through a network interface unit.

One or more program modules and/or data files may be included in external storage memory 206. During operation of the system 200, one or more of these elements included in the external storage memory 206 may also reside in a portion of memory 204, such as, for example, RAM for controlling the operation of the user computer 200. The example of FIG. 2 illustrates various components including an operating system 212, other inputs, and/or outputs 214, software modules 216, a data base management system 218 and the invented compiler 220.

An initial listing of software LS.I and a resultant listing of software LS.R are also stored as software modules within the external storage memory 206.

The operating system 212 may be any one of a variety of commercially available or proprietary operating systems. The operating system 212, for example, may be loaded into memory in connection with controlling operation of the system 200. The modules 216 may include one or more executable code modules used in connection with performing the techniques as described herein.

The system 200 may be a server accessible via the Internet or other electronic telephony or communications network and may store software listings LS.I & LS.R in the database management system software 218, (hereinafter, "DBMS 218") such as an object oriented database system provided by Objectivity, Inc. of Mountain View, Calif. or an SQL database software management system as provided by IBM of Armonk, N.Y. The information technology system 200 may be or comprise (a.) a network-communications enabled THINKSTATION WORKSTATION™ notebook computer marketed by Lenovo, Inc. of Morrisville, N.C.; (b.) a NIVEUS 5200 computer workstation marketed by Penguin Computing of Fremont, Calif. and running a LINUX™ operating system or a UNIX™ operating system; (c.) a network-communications enabled personal computer configured for running WINDOWS XP™, VISTA™ or WINDOWS 7™ operating system marketed by Microsoft Corporation of Redmond, Wash.; (d.) a MACBOOK PRO™ personal computer as marketed by Apple, Inc. of Cupertino, Calif.; (e.) an IPAD™ tablet computer as marketed by Apple, Inc. of Cupertino, Calif.; (f.) a TOUGHPAD™ tablet computer as marketed by Panasonic Corporation of Kadoma, Osaka, Japan and running an ANDROID™ operating system as marketed by Google, Inc. of Mountain View, Calif.; or (g.) other suitable computational system or electronic communications device known in the art known in the art.

Figure 3:
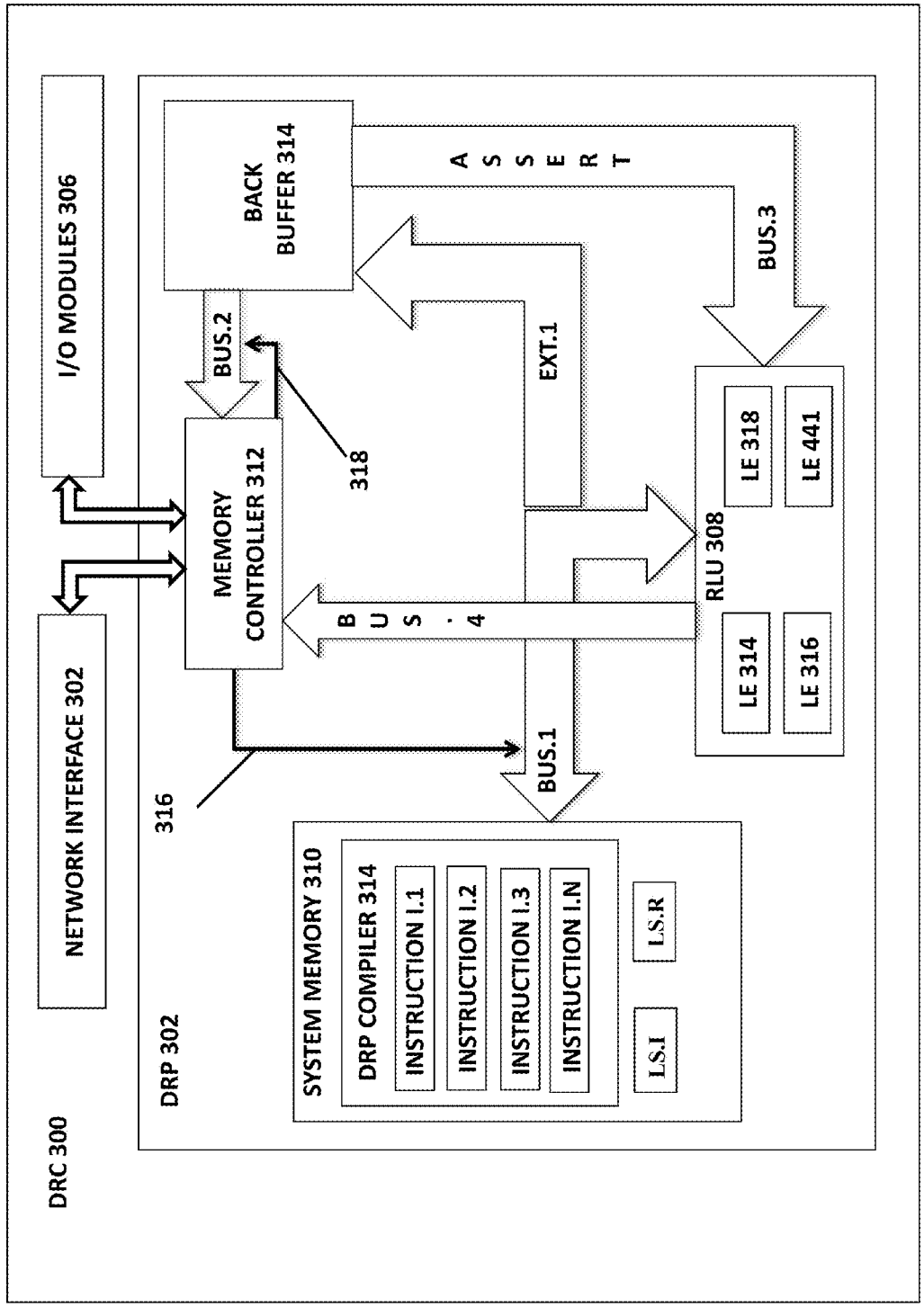
FIG. 3 is a functional block diagram of the dynamically reconfigurable computer of FIG. 1 and presenting a dynamically reconfigurable processor comprising a reconfigurable logic unit having a plurality of homogeneous logic elements.

Referring now generally to the Figures and particularly to FIG. 3, FIG. 3 is a schematic of a dynamically reconfigurable computer 300 (hereafter "DRC" 300). DRC 300 includes a dynamically reconfigurable processor 302 (hereafter "DRP" 302), a network interface 304, and I/O modules 306. The network interface 304 bi-directionally communicatively couples the DRP 302 with the network 100. The I/O modules 306 are in combination bi-directionally communicatively coupled with the DRP 302 and enable a human user to interact with the DRC 300 by providing a digital keyboard input device, a display screen output device, and/or a touch screen display module.

The DRP 302 includes a reprogrammable logic unit 308 (hereinafter, "RLU" 308), a system memory 310, a memory controller 312, and a back buffer 314. The system memory 310 stores various software, to include a DRP compiler 316, the initial software listing LS.I, the resultant complied software listing LS.R. The instructions I.1-I.N are comprised within the DRP compiler 316 and enable the DRC 300 to derive the resultant complied software listing LS.R by compiling the initial software listing LS.I.

The memory controller 312 preferably directs the operations of at least four buses BUS.1-BUS.4. A first bus BUS.1 includes a first extension and bidirectionally communicatively couples the RLU 308, the system memory 310 and the back buffer 314 as directed by the memory controller 312 via a first bus control line(s) 316. A second bus BUS.2 communicatively couples the system memory 310 and the back buffer 314 as directed by the memory controller 312 via a second bus control line(s) 318. A third bus BUS.3 communicatively couples the back buffer 314 and the RLU 308 as directed by the memory controller 312 via a third bus control line(s) (not shown). A fourth bus BUS.4 communicatively couples the RLU 308 and the memory controller 312 as directed by the memory controller 312 via a fourth bus control line(s) (not shown).

The RLU 308 includes a plurality of homogeneous logic units 314-441 that are communicatively coupled in a static continuous toroidal pattern.

Figure 4:
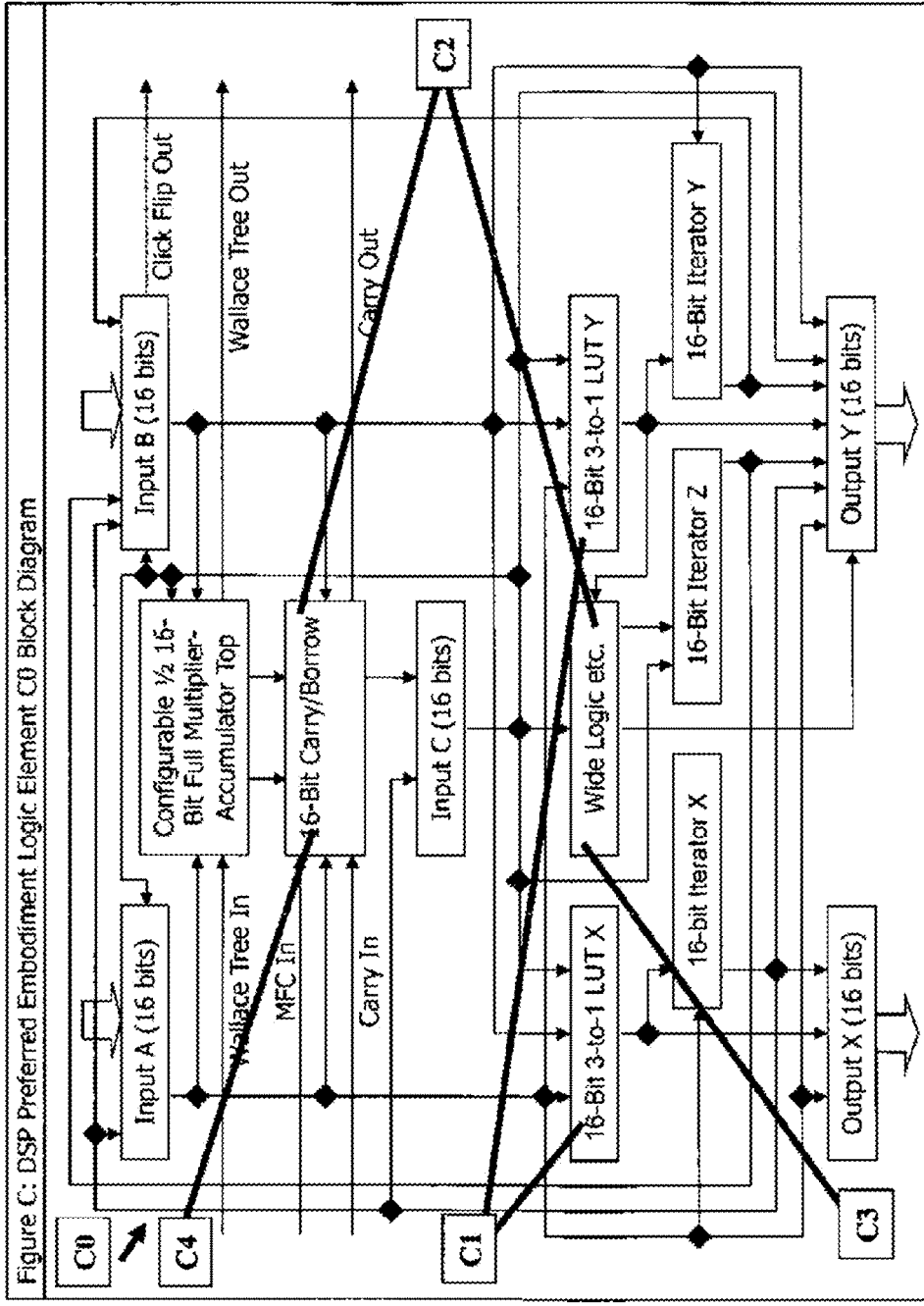
FIG. 4 is a functional block diagram of an exemplary logic element of the dynamically reconfigurable processor FIG. 3.

Referring now generally to the Figures and particularly to FIG. 4, FIG. 4 is a schematic of an exemplary first logic element 314 of the RLU 308. Logic element 314 includes a plurality of circuits and signal routing pathways, to include a 16-bit input A register, a 16-bit input B register, a 16-bit input C register, a 16-bit output X register, a 16-bit output Y register, a 16-bit 3- to 1 look up table X, a 16-bit look up table Y, a 16-bit iterator X, a 16-bit iterator Y, a 16-bit iterator Z, a wide logic circuit, a 16-bit carry/borrow circuit, a configurable 16-bit full multiplier-accumulator top circuit, and various signal routing. The signal routing pathways of the exemplary first logic element 314 include click flip out, Wallace tree in, Wallace tree out, MFC in, carry in, and carry out. It is understood that certain signal routing pathways, e.g., click flip out, Wallace tree in and Wallace tree out, are directly coupled with adjacent logic elements 441 & 315.

FIG. 5 is a functional block diagram of the layout of the homogeneous logic elements 314-441 of the RLU 308 of FIGS. 3 and 4 and presenting 128 individual logic elements 314-441.

Figure 6A:
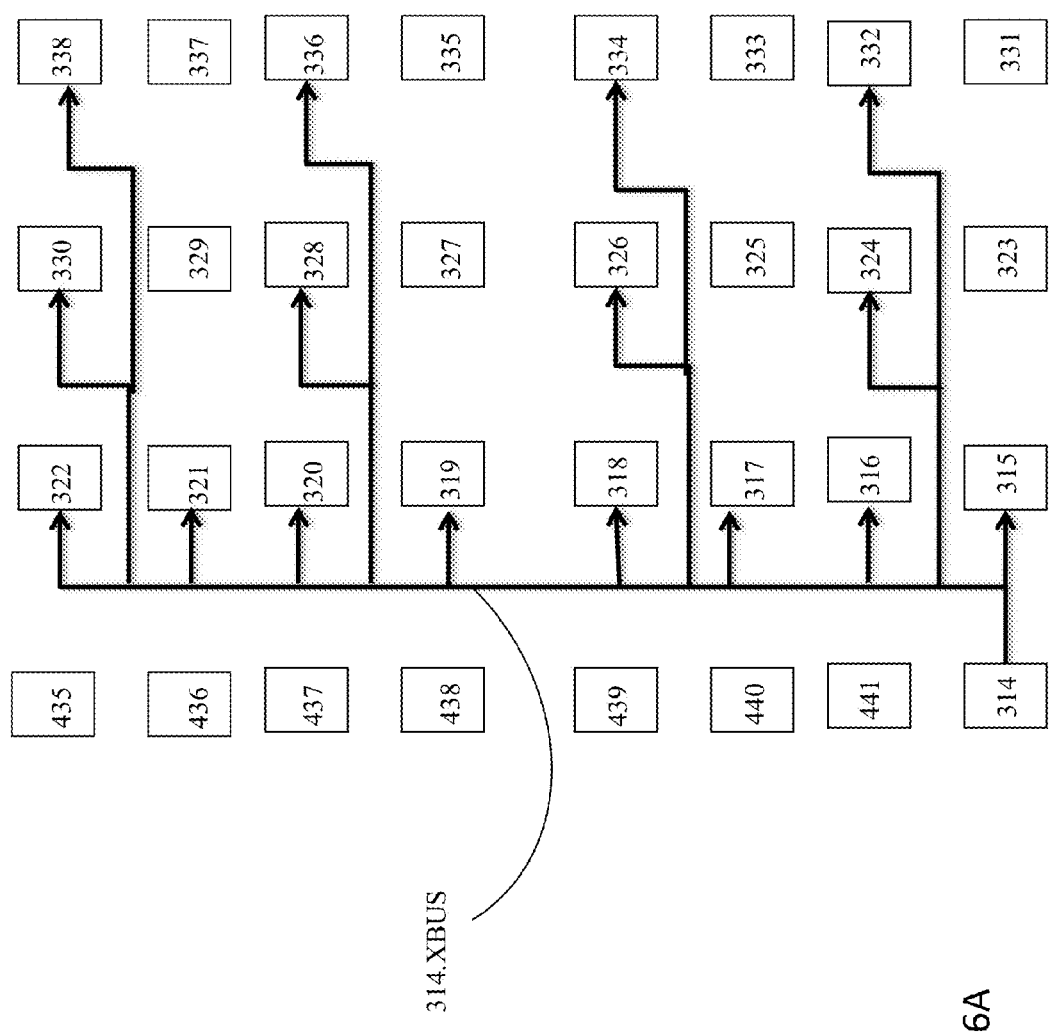
FIG. 6A is a schematic of an exemplary X output bus of the reconfigurable logic unit of FIGS. 3, 4 and 5 that provides signal connectivity of an X output of the first exemplary logic unit to the input ports of sixteen succeeding logic elements of the same reconfigurable logic unit.

FIG. 6A is a schematic of an exemplary first X output bus 314.XBUX of the reconfigurable logic unit of FIGS. 3, 4 and 5 of an exemplary logic element 314 that provides signal connectivity of an X output of the first exemplary logic 314 unit to the input ports of sixteen succeeding logic elements of the same reconfigurable logic unit. It is understood that each of two outputs X & Y of each logic element is unidirectionally communicatively coupled with the three inputs A, B & C of sixteen succeeding logic elements, preferably in a staggered pattern wherein certain succeeding logic elements are left unconnected. This pattern of selective and limited connectivity of logic element 314-441 within the RLU 308 enables a trade off of providing sufficient connectivity among the logic elements 314-441 while conserving room on a semiconductor substrate.

The exemplary first logic element bus 314.BUS of the first logic element 314 enables signals to travel from the X output of the first logic element 314 to sixteen sets of inputs A, B & C of sixteen separate succeeding logic elements 315-322, 324, 326, 328, 330, 332, 334, 336, & 338.

Figure 6B:
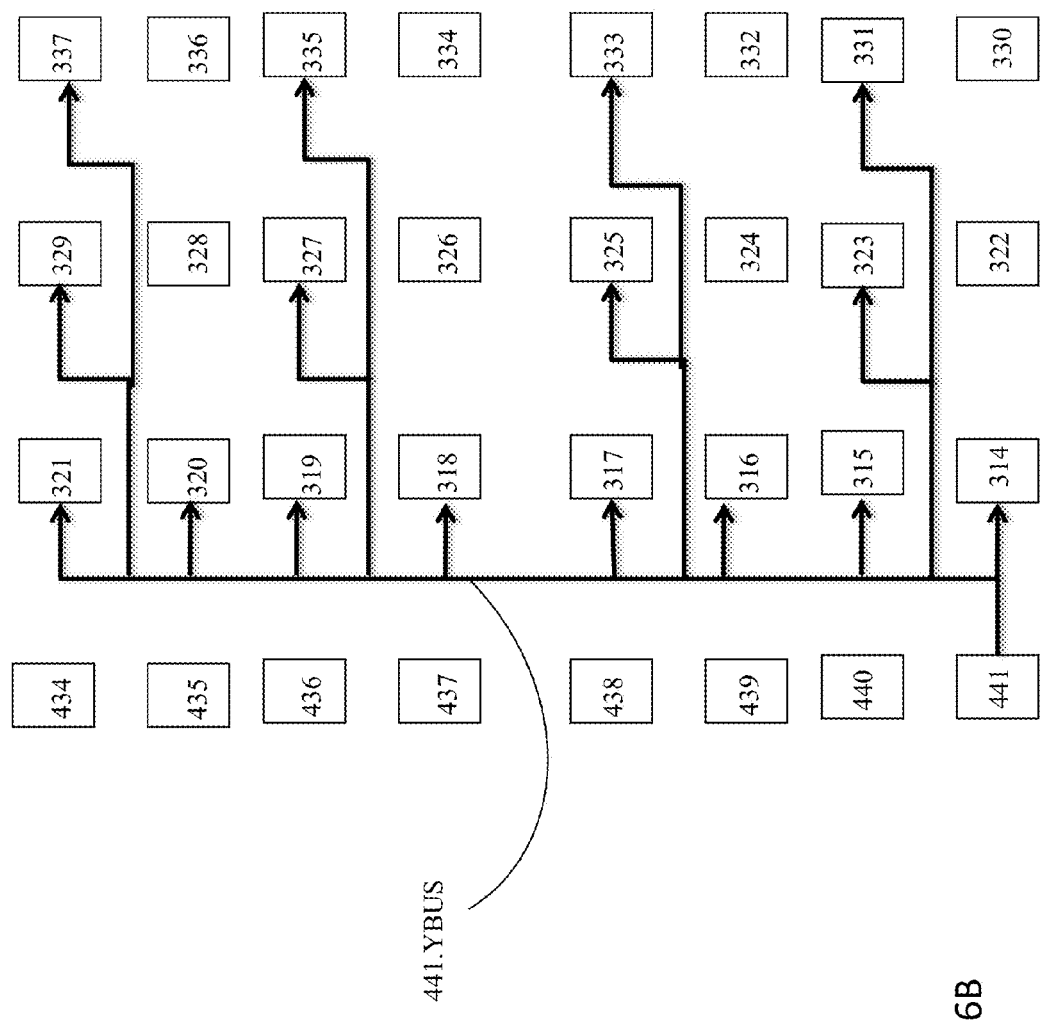
FIG. 6B is a schematic of an exemplary final Y output bus of the reconfigurable logic unit of FIGS. 3, 4 and 5 of an exemplary X bus that provides signal connectivity of a Y output of the final exemplary logic unit to the input ports of sixteen succeeding logic elements of the same reconfigurable logic unit.

Referring now generally to the Figures and particularly to FIG. 6B, FIG. 6B is a schematic of an exemplary output bus 441.YBUS of an exemplary final logic element 441 that provides signal connectivity of a Y output of the final logic element 441 to the input ports of sixteen succeeding logic elements 314-321, 323, 325, 327, 329, 331, 333, 335 & 337 of the same reconfigurable logic unit 308.

Referring now generally to the Figures and particularly to FIG. 7A through FIG. 9, the exemplary method presented is essentially explanatory and meant to clarify the invented method and is not intended to limit the scope of the invention as claimed. Those skilled in the art will appreciate that various adaptations and modifications of the steps of the present disclosure, as made obvious in light of the present disclosure, can be modified without departing from the scope and spirit of the invention as claimed.

Referring now generally to the Figures and particularly to FIGS. 7A through 7I, FIGS. 7A through 7I presents a flow chart of the processor's 202 Placement and Routing function of the invented method.

Figure 7A:
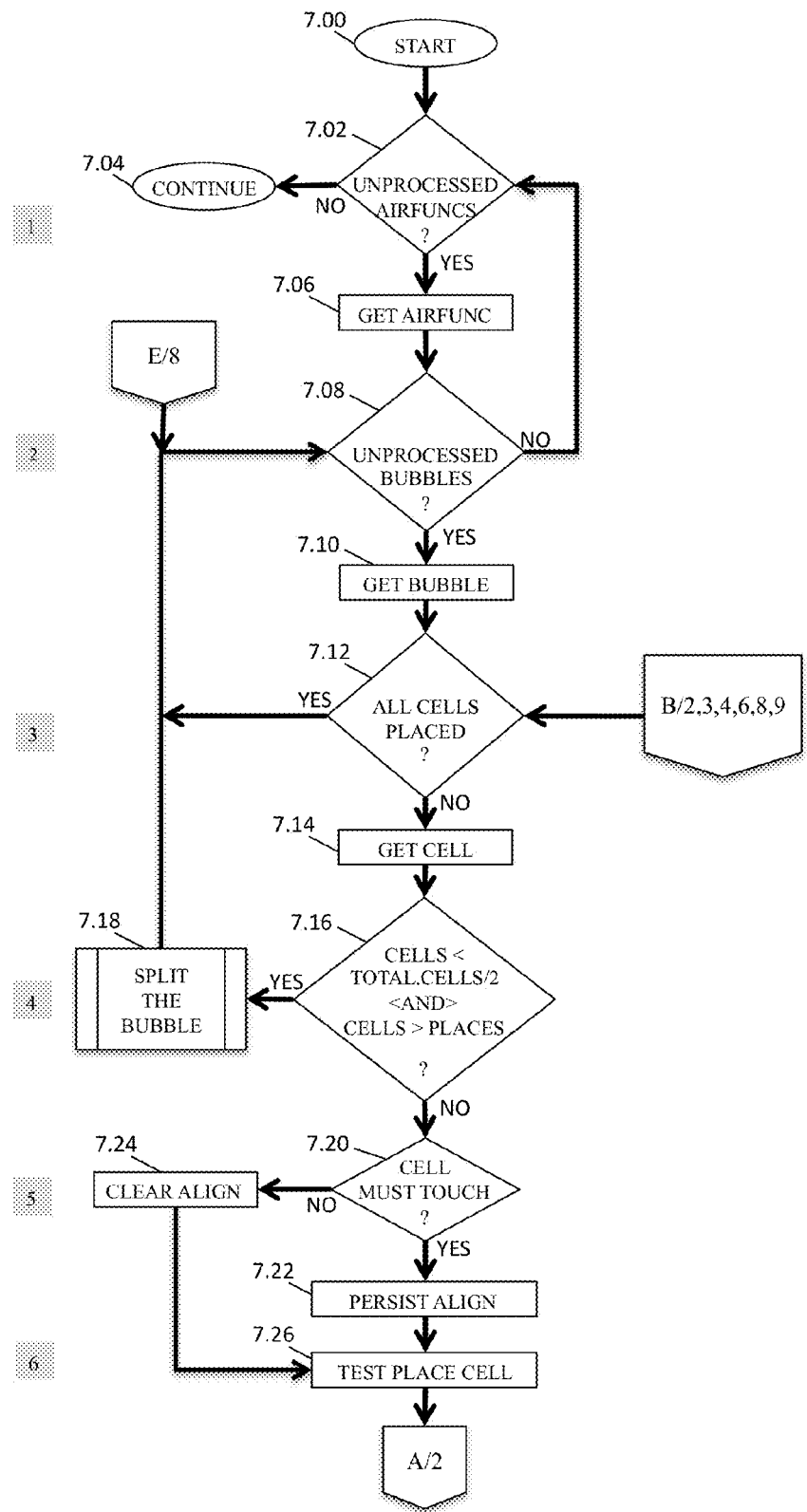
FIGS. 7A through 7I form a flow chart expressing certain aspects of invented compilers of FIG. 2 and FIG. 3 that are in accordance with a first preferred embodiment of the invented method.

Referring now to FIG. 7A, in step 7.02 the processor 202 determines whether an unprocessed airfunc/function is present. An airfunc is a software object that is a container of one or more bubbles.

When the processor 202 determines that an unprocessed airfunc is present the processor 202 proceeds on to step 7.06 to get an unprocessed airfunc to operate on. In the alternative, when the processor 202 determines that an unprocessed airfunc is not present the processor 202 proceeds from step 7.02 to step 7.04 and is done.

The processor 202 proceeds from step 7.06 to step 7.08. In step 7.08 the processor 202 determines whether an unprocessed bubble/instruction is present. When the processor 202 determines that an unprocessed bubble is present the processor 202 proceeds on to step 7.10 to get an unprocessed bubble to operate on. In the alternative, when the processor 202 determines that an unprocessed bubble is not present the processor 202 proceeds from step 7.08 to step 7.02.

The processor 202 proceeds from step 7.10 to step 7.12. In step 7.12 the processor 202 determines if all cells/elements have been placed. When the processor 202 determines that not all cells have been placed the processor 202 proceeds on to step 7.14 to get an unplaced cell. In the alternative, when the processor 202 determines that all cells have been placed the processor 202 proceeds from step 7.12 to step 7.08.

The processor 202 proceeds from step 7.14 to step 7.16. In step 7.16 the processor 202 determines whether the number of unplaced cells is less than half the total cells and whether the number of unplaced cells is greater than the remaining places. When the processor 202 determines that the number of unplaced cells is less than half the total cells and the number of unplaced cells is greater than the remaining places, the processor 202 proceeds on to step 7.18 to perform the "Split The Bubble" flowchart producing two unprocessed bubbles. The processor 202 proceeds from step 7.18 to step 7.08. In the alternative, when the processor 202 determines that the number of unplaced cells is not less than half the total cells or the number of unplaced cells is not greater than the remaining places the processor 202 proceeds from step 7.16 to step 7.20.

In step 7.20 the processor 202 determines if this cell must touch the previous cell. When the processor 202 determines that this cell must touch the previous cell, the processor 202 proceeds on to step 7.22 to persist the alignment state. The processor 202 proceeds from step 7.22 to step 7.26. In the alternative, when the processor 202 determines that this cell is not required to touch the previous cell the processor 202 proceeds from step 7.20 to step 7.24 to clear the alignment state. The processor 202 proceeds from step 7.24 to step 7.26.

In step 7.26 the processor 202 test place the cell in the next available location. The processor 202 proceeds from step 7.26 to step 7.28.

Figure 7B:
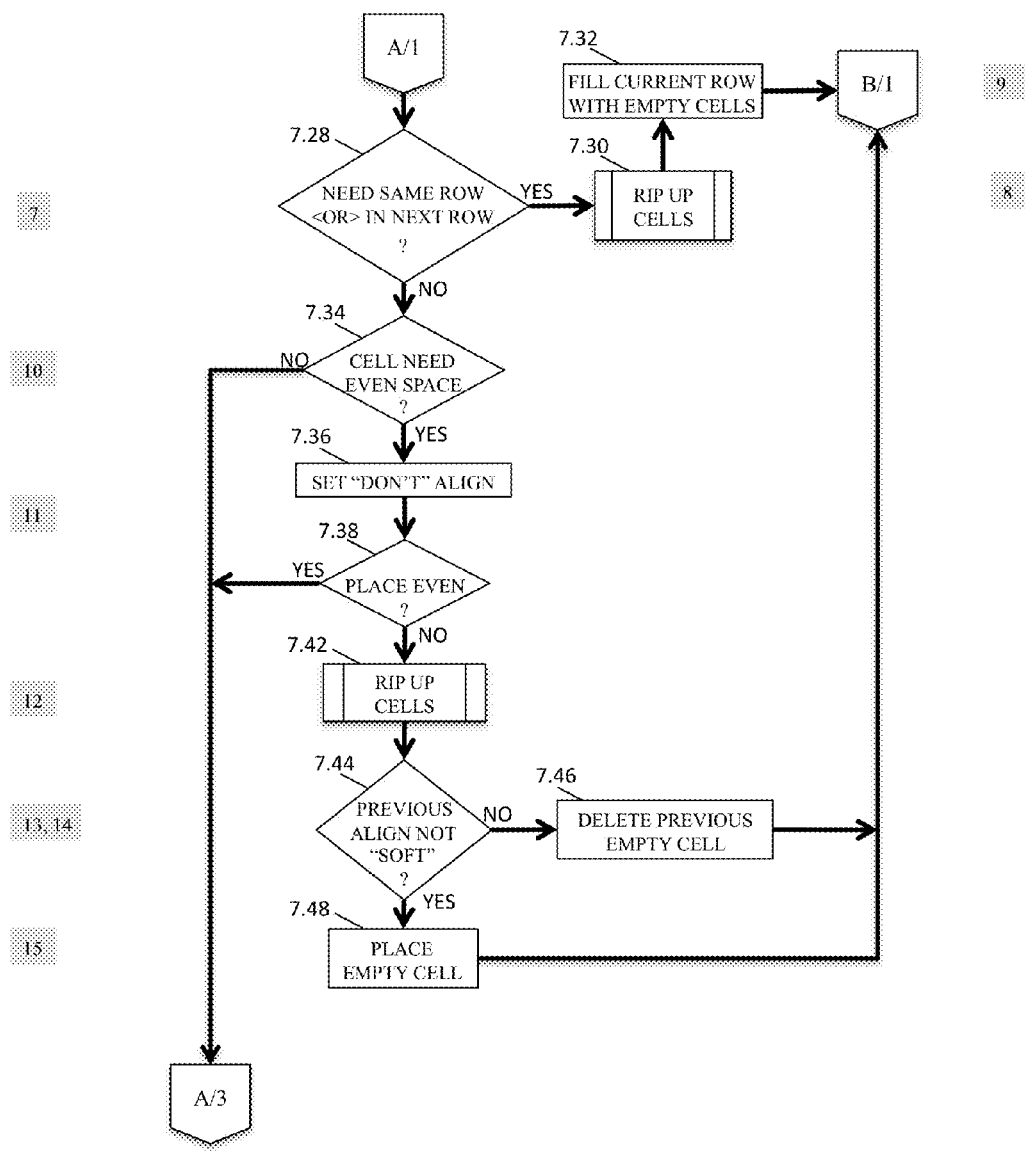

Referring now to FIG. 7B, in step 7.28 the processor 202 determines whether the cell needs to be in the same row as its neighbors or if the cell has not extended into the next row. When the processor 202 determines that the cell does need to be in the same row as its neighbors or the cell has extended into the next row, the processor 202 proceeds on to step 7.30 to perform the "Rip Up Cells" flowchart on the current place. The processor 202 proceeds from step 7.30 to step 7.32 to fill the current row with empty cells. The processor 202 proceeds from step 7.32 to step 7.12. In the alternative, when the processor determines that the cell needs to be in the same row as its neighbors or the cell has not extended into the next row, the processor 202 proceeds from step 7.28 to step 7.34.

In step 7.34 the processor 202 determines whether the cell needs an even place. When the processor 202 determines that the cell needs an even place, the processor 202 proceeds on to step 7.36 to set the alignment state to "don't". The processor 202 proceeds from step 7.36 to step 7.38. In the alternative, when the processor determines that the cell does not need an even place, the processor 202 proceeds from step 7.34 to step 7.40.

In step 7.38 the processor 202 determines whether the place is even. When the processor 202 determines that the place is not even, the processor 202 proceeds on to step 7.42 to perform the "Rip Up Cells" flowchart on the current place. The processor 202 proceeds from step 7.42 to step 7.44. In the alternative, when the processor determines that the place is even, the processor 202 proceeds from step 7.38 to step 7.40.

In step 7.44 the processor 202 determines whether the previous alignment was soft. When the processor 202 determines that the previous alignment was soft, the processor 202 proceeds on to step 7.46 and to delete the previous empty cell. The processor 202 proceeds from step 7.46 to step 7.12. In the alternative, when the processor determines that the previous alignment was not soft, the processor 202 proceeds from step 7.44 to step 7.48 to place an empty cell. The processor 202 proceeds from step 7.48 to step 7.12.

Figure 7C:
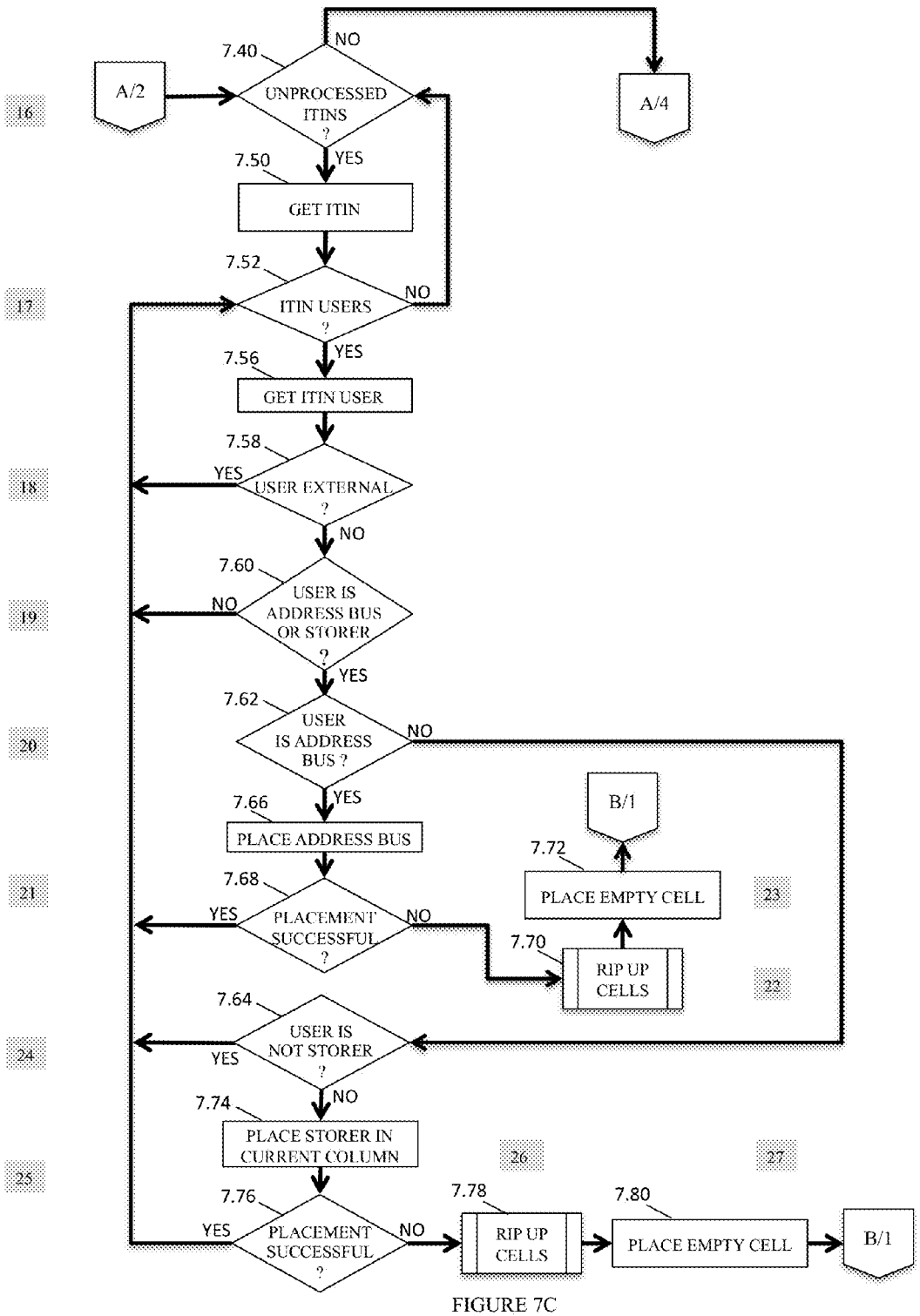

Referring now to FIG. 7C, in step 7.40 the processor 202 determines whether an unprocessed itin is present. An "itin" is a software object that represents an input to an iterator, i.e., a resource representing an interator input.

When the processor 202 determines that an unprocessed itin is present, the processor 202 proceeds on to step 7.50 to get an unprocessed itin in the cell. The processor 202 proceeds from step 7.50 to step 7.52. In the alternative, when the processor 202 determines that an unprocessed itin is not present, the processor 202 proceeds from step 7.40 to step 7.54.

In step 7.52 the processor 202 determines whether an unprocessed itin user is present. When the processor 202 determines that an unprocessed itin user is present the processor 202 proceeds on to step 7.56 to get an unprocessed itin user. The processor 202 proceeds from step 7.56 to step 7.58. In the alternative, when the processor 202 determines that an unprocessed itin user is not present, the processor 202 proceeds from step 7.52 to step 7.40.

In step 7.58 the processor 202 determines if the user is external to the bubble. When the processor 202 determines that the user is not external to the bubble, the processor 202 proceeds on to step 7.60. In the alternative, when the processor 202 determines that the user is external to the bubble, the processor 202 considers the user processed and proceeds from step 7.58 to step 7.52.

In step 7.60 the processor 202 determines if the user is an address bus or storer. When the processor 202 determines that the user is an address bus or storer, the processor 202 proceeds on to step 7.62. In the alternative, when the processor 202 determines that the user is not an address bus or storer, the processor 202 considers the user processed and proceeds from step 7.60 to step 7.52.

In step 7.62 the processor 202 determines if the user is an address bus. When the processor 202 determines that the user is not an address bus, the processor 202 proceeds from step 7.62 to step 7.64. In the alternative, when the processor 202 determines that the user is an address, the processor 202 proceeds on to step 7.66 in an attempt to place the address bus in the current column. The processor 202 proceeds from step 7.66 to step 7.68.

In step 7.68 the processor 202 determines if the placement of the address bar in the current column was successful. When the processor 202 determines that the placement of the address bar in the current column was successful, the processor 202 proceeds from step 7.68 to step 7.52. In the alternative, when the processor 202 determines that the placement of the address bar in the current column was not successful, the processor 202 proceeds on to step 7.70 to perform the "Rip Up Cells" flowchart on the current place. The processor 202 proceeds from step 7.70 to step 7.72 to place an empty cell. The processor 202 proceeds from step 7.72 to step 7.12.

In step 7.64 the processor 202 determines if the user is a storer. When the processor 202 determines that the user is not a storer, the processor 202 proceeds from step 7.64 to step 7.52. In the alternative, when the processor 202 determines that the user is a storer, the processor 202 proceeds on to step 7.74 in an to attempt to place the storer in the current column. The processor 202 proceeds from step 7.74 to step 7.76.

In step 7.76 the processor 202 determines if the storer placement was successful. When the processor 202 determines that the storer placement was successful, the processor 202 proceeds from step 7.76 to step 7.52. In the alternative, when the processor 202 determines that the storer placement was not successful, the processor 202 proceeds on to step 7.78 to perform the "Rip Up Cells" flowchart on the current place. The processor 202 proceeds from step 7.78 to step 7.80 and to place an empty cell. The processor 202 proceeds from step 7.80 to step 7.12.

Figure 7D:
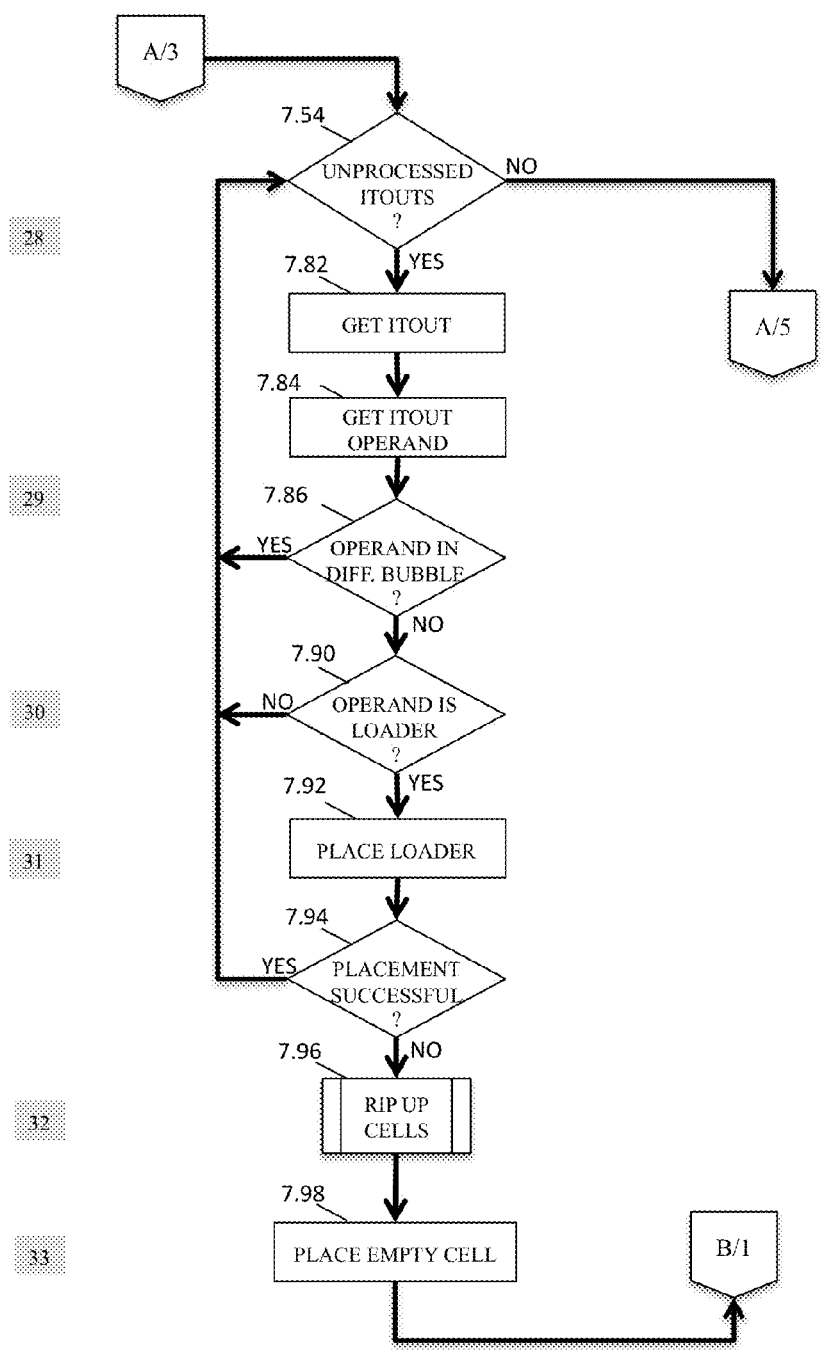

Referring now to FIG. 7D, in step 7.54 the processor 202 determines whether an unprocessed itout is present. An "itout" is a software object that represents an output of an iterator, i.e., a resource representing an iterator output.

When the processor 202 determines that an unprocessed itout is present, the processor 202 proceeds on to step 7.82 to get an unprocessed itout. The processor 202 proceeds from step 7.82 to step 7.84 and to get itout's operand. The processor 202 proceeds from step 7.84 to step 7.86. In the alternative, when the processor 202 determines that an unprocessed itout is not present, the processor 202 proceeds from step 7.54 to step 7.88.

In step 7.86 the processor 202 determines whether the operand is in a different bubble.

When the processor 202 determines that the operand is in a different bubble, the processor 202 proceeds from step 7.86 to step 7.54. In the alternative, when the processor 202 determines that the operand is not in a different bubble the processor 202 proceeds on to step 7.90.

In step 7.90 the processor 202 determines whether the operand is a loader. When the processor 202 determines that the operand is not a loader, the processor 202 proceeds from step 7.90 to step 7.54. In the alternative, when the processor 202 determines that the operand is a loader, the processor 202 proceeds on to step 7.92 to perform the function attempting to place the loader in the current column. The processor 202 proceeds from step 7.92 to step 7.94.

In step 7.94 the processor 202 determines whether the placement of the loader was successful. When the processor 202 determines that the placement of the loader was successful, the processor 202 proceeds from step 7.94 to step 7.54. In the alternative, when the processor 202 determines that the placement of the loader was not successful, the processor 202 proceeds on to step 7.96 to perform the "Rip Up Cells" flowchart on the current place. The processor 202 proceeds from step 7.96 to step 7.98 to perform the function of placing an empty cell. The processor 202 proceeds from step 7.98 to step 7.12.

Figure 7E:
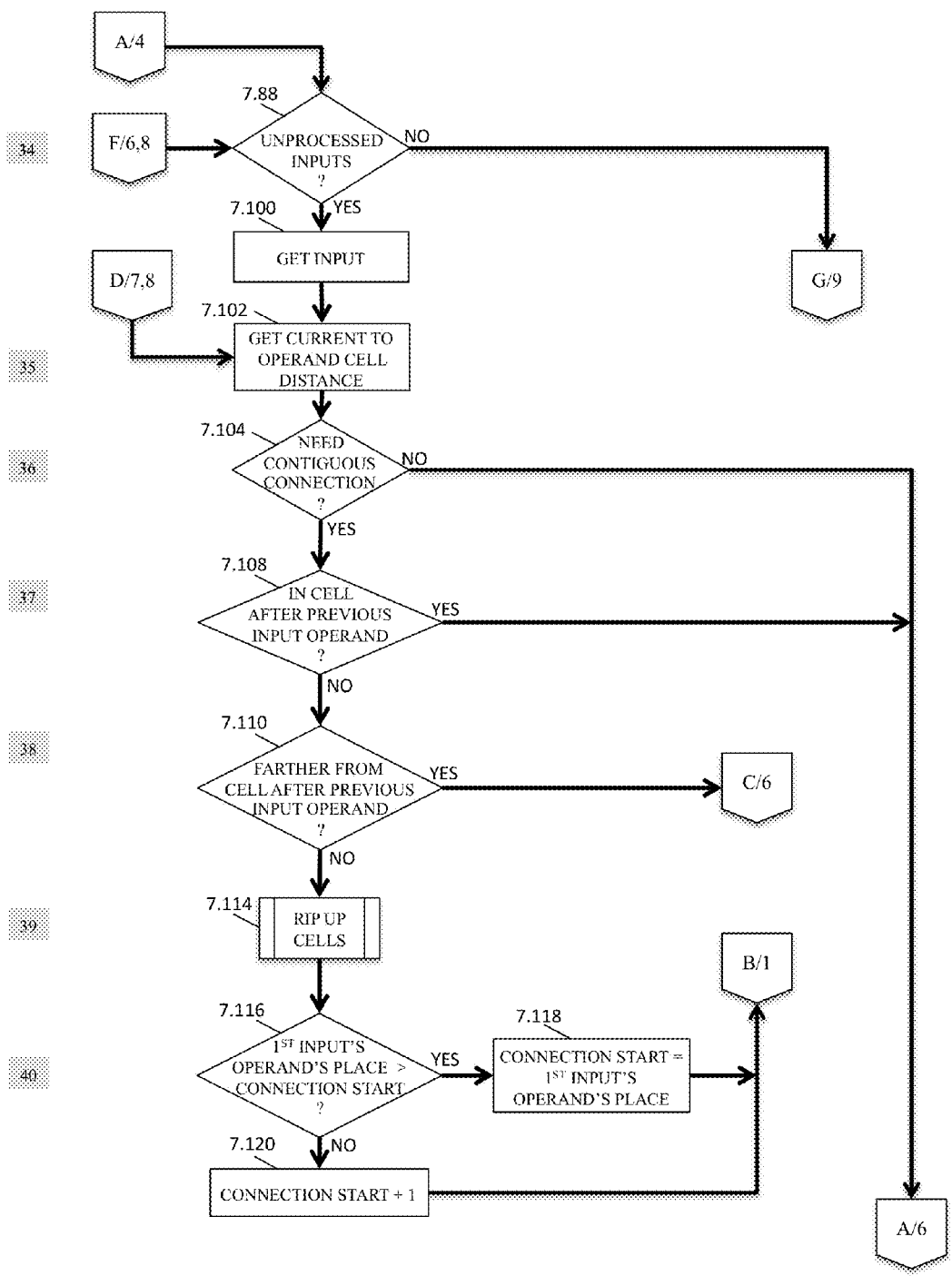

Referring now to FIG. 7E, in step 7.88 the processor 202 determines whether an unprocessed input is present. When the processor 202 determines that an unprocessed input is present the processor 202 proceeds on to step 7.100 to get an unprocessed input. The processor 202 proceeds from step 7.100 to step 7.102 to perform the function of calculating the distance between the current cell and its operand cell. The processor 202 proceeds from step 7.102 to step 7.104. In the alternative, when the processor 202 determines that an unprocessed input is not present, the processor 202 proceeds from step 7.88 to step 7.106.

In step 7.104 the processor 202 determines whether the input needs a contiguous connection. When the processor 202 determines that the input does not need a contiguous connection, the processor 202 proceeds from step 7.104 to step 7.106. In the alternative, when the processor 202 determines that the input needs a contiguous connection, the processor 202 proceeds on to step 7.108.

In step 7.108 the processor 202 determines if the operand is in the cell directly after the operand of the previous input. When the processor 202 determines that the operand is in the cell directly after the operand of the previous input, the processor 202 proceeds from step 7.108 to step 7.106. In the alternative, when the processor 202 determines that the operand is not in the cell directly after the operand of the previous input, the processor 202 proceeds on to step 7.110.

In step 7.110 the processor 202 determines whether the operand is farther away than the cell directly after the operand of the previous input. When the processor 202 determines that the operand is farther away than the cell directly after the operand of the previous input, the processor 202 proceeds from step 7.110 to step 7.112. In the alternative, when the processor 202 determines that the operand is not farther away than the cell directly after the operand of the previous input, the processor 202 proceeds on to step 7.114 to perform the "Rip Up Cells" flowchart on the current place. The processor 202 proceeds from step 7.114 to step 7.116.

In step 7.116 the processor 202 determines whether the first input's operand's place is greater than the connection start. When the processor 202 determines that the first input's operand's place is greater than the connection start, the processor 202 proceeds on to step 7.118 to set the connection start equal to the first input's operand's place. The processor 202 proceeds from step 7.118 to step 7.12. In the alternative, when the processor 202 determines that the first input's operand's place is not greater than the connection start, the processor 202 proceeds on to step 7.120 to add one to the connection start. The processor 202 proceeds from step 7.120 to step 7.12.

Figure 7F:
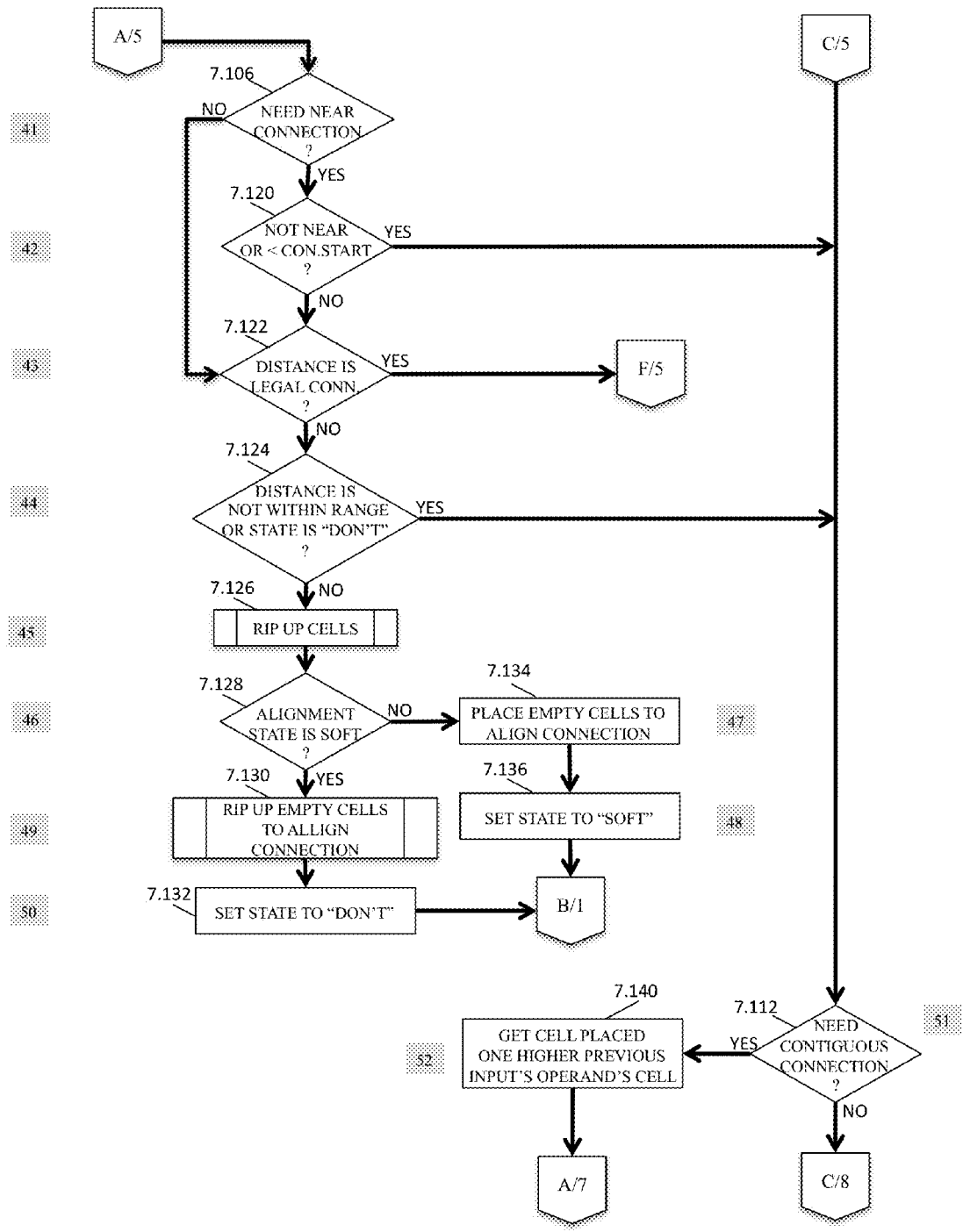

Referring now to FIG. 7F, in step 7.106 the processor 202 determines whether the input needs a near connection. When the processor 202 determines that the input does not need a near connection, the processor 202 proceeds from step 7.106 to step 7.122. In the alternative, when the processor 202 determines that the input needs a near connection, the processor 202 proceeds on to step 7.120.

In step 7.120 the processor 202 determines whether the input operand is near or less than the connection start. When the processor 202 determines that the input operand is not near or less than the connection start, the processor 202 proceeds from step 7.120 to step 7.112. In the alternative, when the processor 202 determines that the input operand is near or less than the connection start, the processor 202 proceeds on to step 7.122.

In step 7.122 the processor 202 determines whether the distance represents a legal connection. When the processor 202 determines that the distance represents a legal connection, the processor 202 proceeds from step 7.122 to step 7.88. In the alternative, when the processor 202 determines that the distance does not represent a legal connection, the processor 202 proceeds on to step 7.124.

In step 7.124 the processor 202 determines whether the distance is within legal connection range or the alignment state is "don't". When the processor 202 determines that the distance is not within legal connection range or the alignment state is "don't", the processor 202 proceeds from step 7.124 to step 7.112. In the alternative, when the processor 202 determines that the distance is within legal connection range or the alignment state is not "don't", the processor 202 proceeds on to step 7.126 to perform the "Rip Up Cells" flowchart on the current place. The processor 202 proceeds from step 7.126 to step 7.128.

In step 7.128 the processor 202 determines whether the alignment state is "soft". When the processor 202 determines that the alignment state is "soft", the processor 202 proceeds on to step 7.130 to rip up empty cells sufficient to align the connection. The processor 202 proceeds from step 7.130 to step 7.132 to set the alignment state to "don't". The processor 202 proceeds from step 7.132 to step 7.12. In the alternative, when the processor 202 determines that the alignment state is not "soft", the processor 202 proceeds on to step 7.134 to place empty cells sufficient to align the connection. The processor 202 proceeds from step 7.134 to step 7.136 to set the alignment state to "soft". The processor 202 proceeds from step 7.136 to step 7.12.

In step 7.112 the processor 202 determines whether the input needs a contiguous connection. When the processor 202 determines that the input does not need a contiguous connection the processor 202 proceeds from step 7.112 to step 7.138. In the alternative, when the processor 202 determines that the input needs a contiguous connection, the processor 202 proceeds on to step 7.140 to get the cell placed one higher than the previous input's operand's cell. The processor 202 proceeds from step 7.140 to step 7.142

Figure 7G:
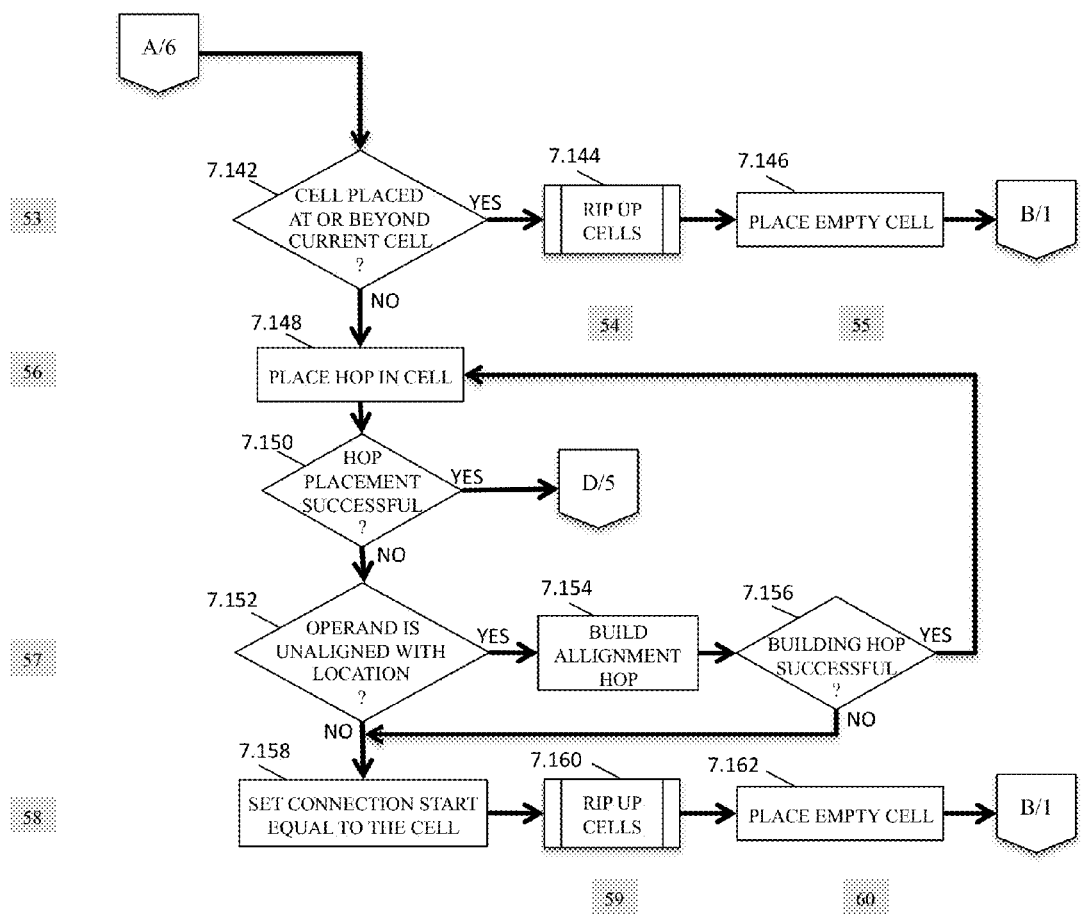

Referring now to FIG. 7G, in step 7.142 the processor 202 determines whether the cell identified in step 7.140 is placed at or beyond the current cell. When the processor 202 determines that the cell identified in step 7.140 is placed at or beyond the current cell, the processor 202 proceeds on to step 7.144 to perform the "Rip Up Cells" flowchart on the current place. The processor 202 proceeds from step 7.144 to step 7.146 to place an empty cell. The processor 202 proceeds from step 7.146 to step 7.12. In the alternative, when the processor determines that the cell identified in step 7.140 is not placed at or beyond the current cell, the processor 202 proceeds from step 7.142 to step 7.148 to place a hop in the cell identified in step 7.140. The processor 202 proceeds from step 7.148 to step 7.150.

In step 7.150 the processor 202 determines whether the hop placement was successful. When the processor 202 determines that the hop placement was successful, the processor 202 proceeds from step 7.150 to step 7.102. In the alternative, when the processor 202 determines that the hop placement was not successful, the processor 202 proceeds on to step 7.152.

In step 7.152 the processor 202 determines whether the hop placement failed because the operand is unaligned with the desired location. When the processor 202 determines that the hop placement failed because the operand is unaligned with the desired location, the processor 202 proceeds on to step 7.154 to build an alignment hop to the desired cell. The processor 202 proceeds from step 7.154 to step 7.156. In the alternative, when the processor determines that the hop placement failed not because the operand is unaligned with the desired location, the processor 202 proceeds from step 7.152 to step 7.158 to set the connection start equal to the cell identified in step 7.140.

The processor 202 proceeds on to step 7.160 to perform the "Rip Up Cells" flowchart on the current place. The processor 202 proceeds from step 7.160 to step 7.162 to place an empty cell. The processor 202 proceeds from step 7.162 to step 7.12.

In step 7.156 the processor 202 determines whether building an alignment hop to the desired cell was successful. When the processor 202 determines that building an alignment hop to the desired cell was successful, the processor 202 proceeds from step 7.156 to step 7.148. In the alternative, when the processor 202 determines that building an alignment hop to the desired cell was not successful, the processor 202 proceeds from step 7.156 to step 7.158.

Figure 7H:
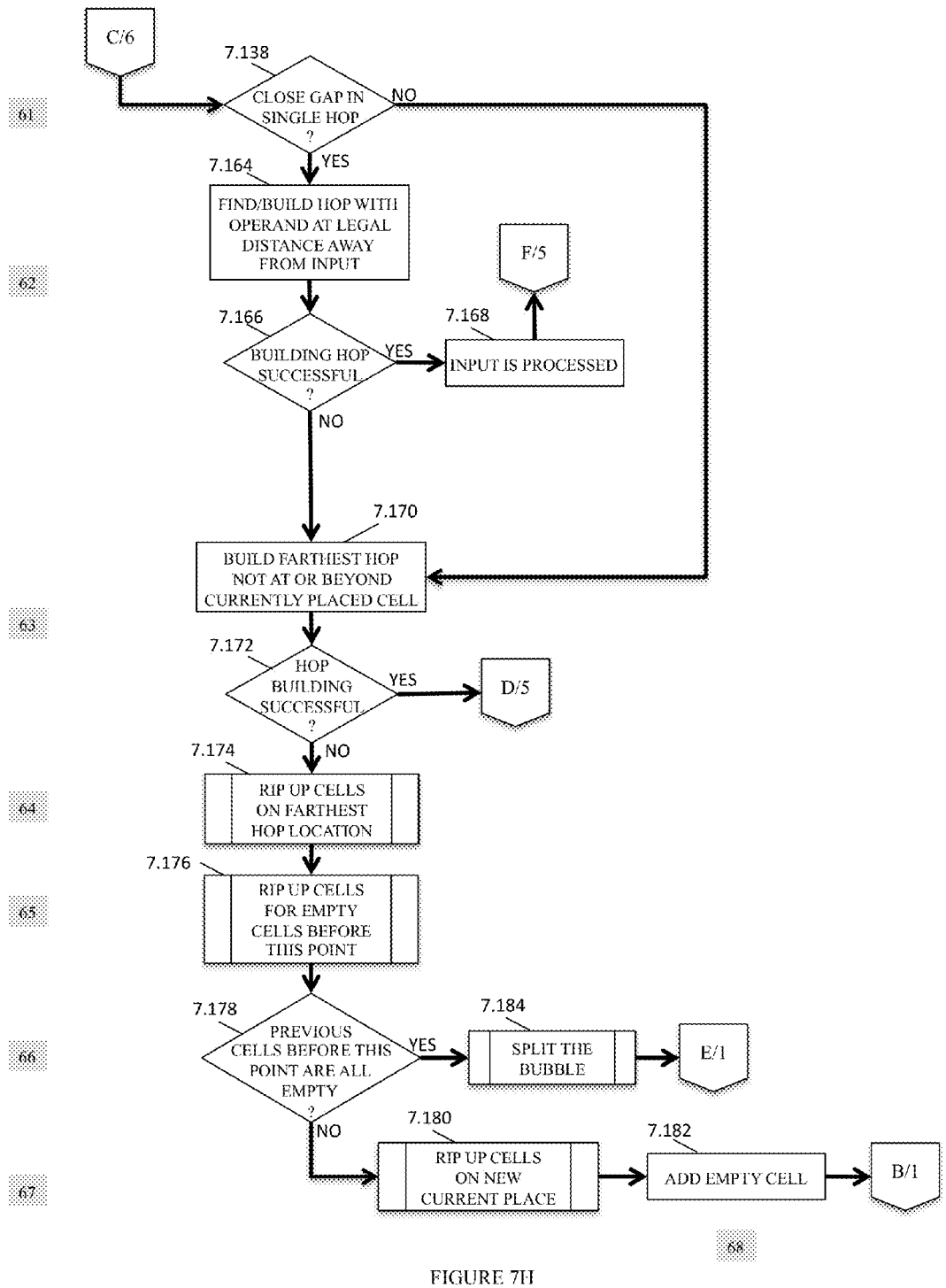
Figure 7I:
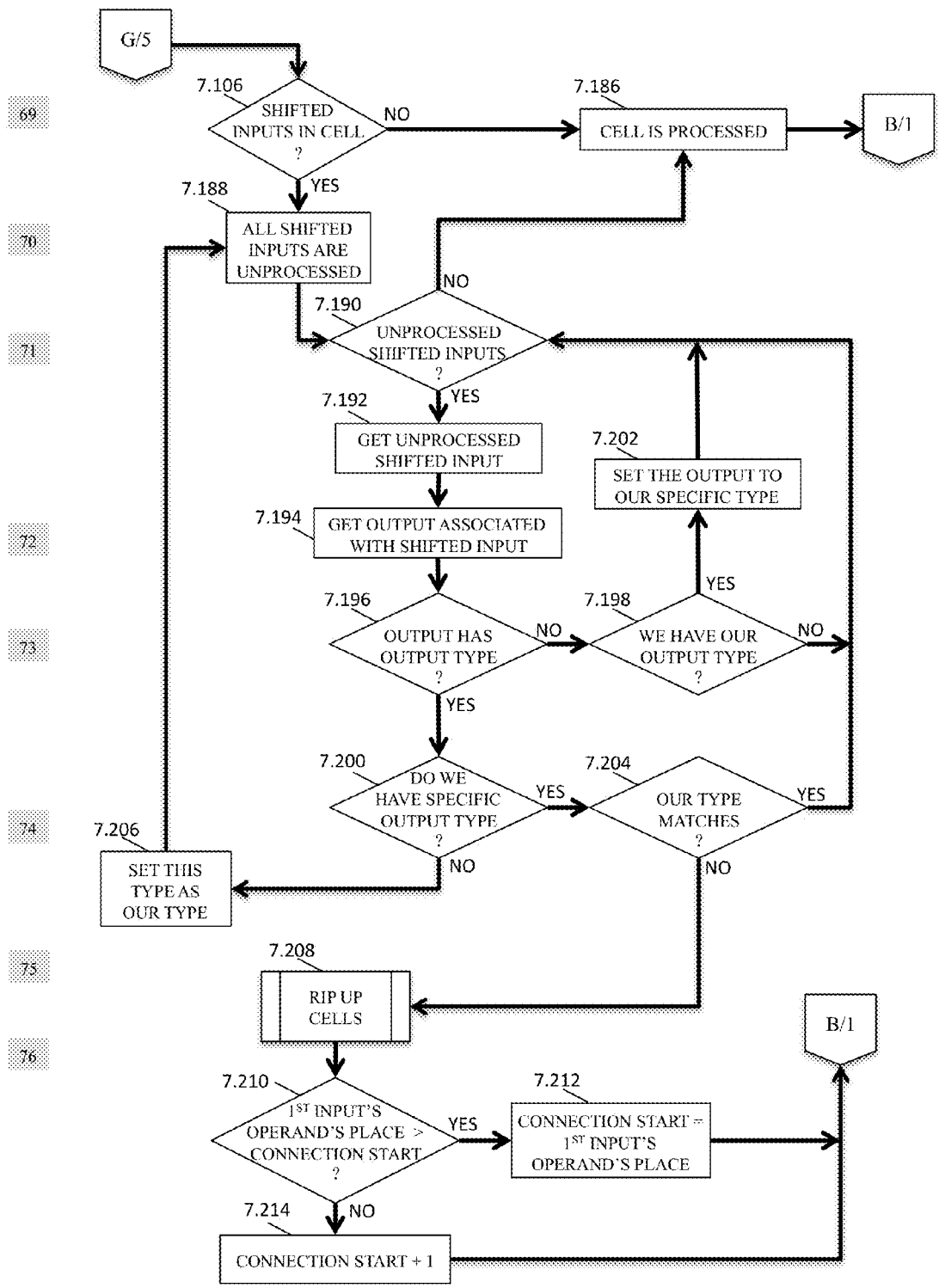

Referring now to FIG. 7H, in step 7.138 the processor 202 determines whether the gap in a single hop can be closed. When the processor 202 determines that the gap in a single hop can be closed, the processor 202 proceeds on to step 7.164 to find and build a single hop that puts the operand at a legal distance away from the input. The processor 202 proceeds from step 7.164 to step 7.166. In the alternative, when the processor 202 determines that the gap in a single hop cannot be closed, the processor 202 proceeds on to step 7.170 to find and build the farthest legal hop that is not at or beyond the currently placed cell. The processor 202 proceeds from step 7.170 to step 7.172.

In step 7.166 the processor 202 determines if the building of a single hop puts the operand at a legal distance away from the input was successful. When the processor 202 determines that building a single hop that puts the operand a legal distance away from the input was successful, the remaining distance represents a legal connection so the processor 202 proceeds on to step 7.168 to process this input. The processor 202 proceeds from step 7.168 to step 7.88. In the alternative, when the processor 202 determines that building of a single hop that puts the operand at a legal distance away from the input was not successful, the processor 202 proceeds on to step 7.170.

In step 7.172 the processor 202 determines whether finding and building the farthest legal hop is at or beyond the currently placed cell. When the processor 202 determines that finding and building the farthest legal hop is at or beyond the currently placed cell was successful, the processor 202 proceeds from step 7.172 to step 7.102. In the alternative, when the processor 202 determines that finding and building the farthest legal hop is not at or beyond the currently placed cell was unsuccessful, the processor 202 proceeds on to step 7.174 to perform the "Rip Up Cells" flowchart on the farthest hop locations from the operand. The processor 202 proceeds from step 7.174 to step 7.176 to continue performing the "Rip Up Cells" flowchart for any empty cell before this point. The processor 202 proceeds from step 7.176 to step 7.178.

In step 7.178 the processor 202 determines if the previous cells within the range of a connection before this point are (a.) either all empty or assigned merely to transfer a signal between cells; or (b.) assigned in some way other than merely acting to transfer a signal. When the processor 202 determines that the previous cells within the range of a connection before this point are all empty or assigned merely to transfer a signal between cells, the processor 202 proceeds from step 7.178 to step 7.184 to perform the "Split The Bubble" flowchart producing two unprocessed bubbles. The processor 202 proceeds from step 7.184 to step 7.08. In the alternative, when the processor 202 determines that the previous cells within the range of a connection before this point are not all empty, the processor 202 proceeds on to step 7.180 to perform the "Rip Up Cells" flowchart on the new current places. The processor 202 proceeds from step 7.180 to step 7.182 to add an empty cell. The processor 202 proceeds from step 7.182 to step 7.12.

In step 7.106 the processor 202 determines whether there are one or more shifted inputs existing in the cell. When the processor 202 determines that there are no shifted inputs existing in the cell, the processor 202 proceeds on to step 7.186 to process the cell. The processor 202 proceeds from step 7.186 to step 7.12. In the alternative, when the processor 202 determines that at least one shifted input exists in the cell, the processor 202 proceeds on to step 7.188 to consider all shifted inputs to be unprocessed. The processor 202 proceeds from step 7.188 to step 7.190.

In step 7.190 the processor 202 determines whether there are one or more unprocessed shifted inputs existing in the cell. When the processor 202 determines that there are no unprocessed shifted inputs existing in the cell, the processor 202 proceeds from step 7.190 to step 7.186. In the alternative, when the processor 202 determines that at least one unprocessed shifted input exists in the cell, the processor 202 proceeds on to step 7.192 to get an unprocessed shifted input in the cell. The processor 202 proceeds from step 7.192 to step 7.194 to get the output associated with the shifted input. The processor 202 proceeds from step 7.194 to step 7.196.

In step 7.196 the processor 202 determines whether the output identified in step 7.194 has any specific output type (outx or outy). It is understood that the architecture of the DRP 302 may have a limitation requiring that all inputs that feed into a logic element, when intended to operate as or within a shift operation, must be of a same output type, e.g., outx or outy. When the processor 202 determines that the output identified in step 7.194 has no specific output type, the processor 202 proceeds from step 7.196 to step 7.198. In the alternative, when the processor 202 determines that the output identified in step 7.194 has a specific output type, the processor 202 proceeds on to step 7.200.

In step 7.198 the processor 202 determines whether we have our specific output type. When the processor 202 determines that we have our specific output type, the processor 202 proceeds from step 7.198 to step 7.202 to set the output to our specific output type. The processor 202 proceeds from step 7.202 to step 7.190. In the alternative, when the processor 202 determines that we do not have our specific output type, the processor 202 proceeds from step 7.198 to step 7.190.

In step 7.200 the processor 202 determines whether we have a specific output type. When the processor 202 determines that we have a specific output type, the processor 202 proceeds from step 7.200 to step 7.204. In the alternative, when the processor 202 determines that we do not have a specific output type, the processor 202 proceeds from step 7.200 to step 7.206 to set a specific type associated with the output identified in step 7.194 as our type. The processor 202 proceeds from step 7.206 to step 7.188.

In step 7.204 the processor 202 determines whether our specific output type matches with a specific type associated with the output identified in step 7.194. When the processor 202 determines that our specific output type matches with a specific type associated with the output identified in step 7.194, the processor 202 proceeds from step 7.204 to step 7.190. In the alternative, when the processor 202 determines that our specific output type does not match with a specific type associated with the output identified in step 7.194, the processor 202 proceeds from step 7.204 to step 7.208 to perform the "Rip Up Cells" flowchart on the current place. The processor 202 proceeds from step 7.208 to step 7.210.

In step 7.210 the processor 202 determines whether the first input's operand's place is greater than the connection start. When the processor 202 determines that the first input's operand's place is greater than the connection start, the processor 202 proceeds from step 7.210 to step 7.212 to set the connection start equal to the first input's operand's place. The processor 202 proceeds from step 7.212 to step 7.12. In the alternative, when the processor 202 determines that the first input's operand's place is not greater than the connection start, the processor 202 proceeds from step 7.210 to step 7.214 to add one to the connection start. The processor 202 proceeds from step 7.214 to step 7.12.

Figure 8:
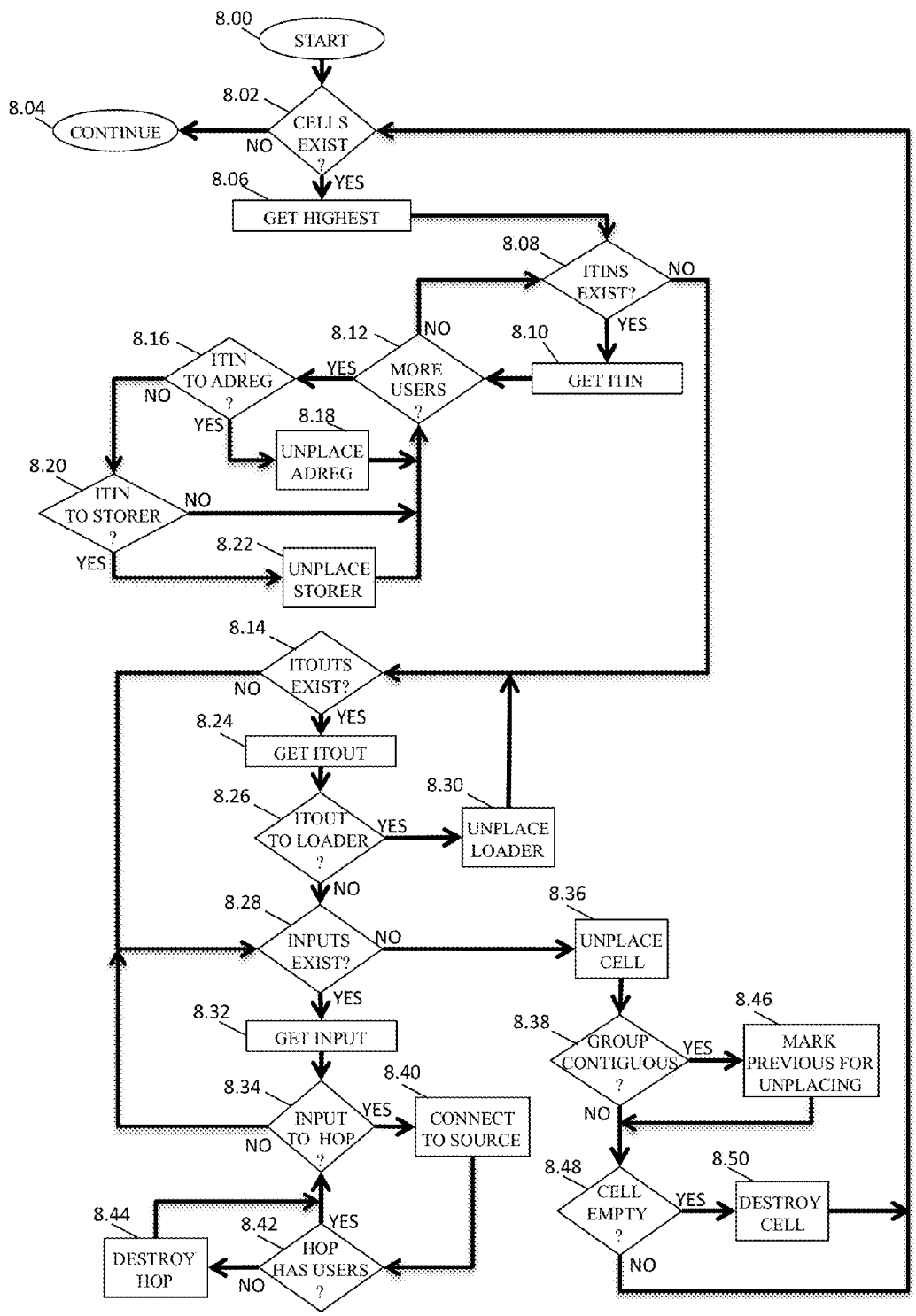
FIG. 8 is a flow chart of a rip up process of the invented compilers of FIG. 2 and FIG. 3.

Referring now generally to the Figures and particularly to FIG. 8, FIG. 8 presents a flow chart of the processor's "Rip Up Cells" function of the invented method.

In step 8.02 the processor 202 determines whether one or more cells exist in the area. When the processor 202 determines that no cells exist in the area, the processor 202 proceeds from step 8.02 to step 8.04 and is done. In the alternative, when the processor 202 determines that at least one cell exist in the area the processor 202 proceeds from step 8.02 to step 8.06 to get the highest cell in the area to unplace. The processor 202 proceeds from step 8.06 to step 8.08.

In step 8.08 the processor 202 determines whether one or more unprocessed itin resources exist. When the processor 202 determines that at least one unprocessed itin resource exists, the processor 202 proceeds from step 8.08 to step 8.10 to get an unprocessed itin resource from the cell. The processor 202 proceeds from step 8.10 to step 8.12. In the alternative, when the processor 202 determines that no unprocessed itin resources exist, the processor 202 proceeds from step 8.08 to step 8.14.

In step 8.12 the processor 202 determines whether more users of the itin exist. When the processor 202 determines that more users of the itin exist, the processor 202 proceeds from step 8.12 to step 8.16. In the alternative, when the processor 202 determines that no more users of the itin exist, the processor 202 proceeds from step 8.12 to step 8.08.

In step 8.16 the processor 202 determines whether the itin is connected to an addreg. An "addreg" is a software object representation of an address bus BUS.4 of the DRP 302.

When the processor 202 determines that the itin is connected to an addreg, the processor 202 proceeds from step 8.16 to step 8.18 to unplace the addreg. The processor 202 proceeds from step 8.18 to step 8.12. In the alternative, when the processor 202 determines that the itin is not connected to an addreg, the processor 202 proceeds from step 8.16 to step 8.20.

In step 8.20 the processor 202 determines whether the itin is connected to a storer. When the processor 202 determines that the itin is connected to a storer, the processor 202 proceeds from step 8.20 to step 8.22 to unplace the storer. The processor 202 proceeds from step 8.22 to step 8.12. In the alternative, when the processor 202 determines that the itin is not connected to a storer, the processor 202 proceeds from step 8.20 to step 8.12.

In step 8.14 the processor 202 determines whether one or more unprocessed itout resources exist. When the processor 202 determines that at least one unprocessed itout resource exist, the processor 202 proceeds from step 8.14 to step 8.24 to get an unprocessed itout resource from the cell. The processor 202 proceeds from step 8.24 to step 8.26. In the alternative, when the processor 202 determines that no unprocessed itout resources exist, the processor 202 proceeds from step 8.14 to step 8.28.

In step 8.26 the processor 202 determines whether the itout is connected to a loader. When the processor 202 determines that the itout is connected to a loader, the processor 202 proceeds from step 8.26 to step 8.30 to unplace the loader. The processor 202 proceeds from step 8.30 to step 8.14. In the alternative, when the processor 202 determines that the itout is not connected to a loader, the processor 202 proceeds from step 8.26 to step 8.28.

In step 8.28 the processor 202 determines whether one or more unprocessed inputs exist. When the processor 202 determines that at least one unprocessed input exists, the processor 202 proceeds from step 8.28 to step 8.32 to get an unprocessed input from the cell. The processor 202 proceeds from step 8.32 to step 8.34. In the alternative, when the processor 202 determines that there are no unprocessed inputs remaining, the processor 202 proceeds from step 8.28 to step 8.36 to unplace the cell. The processor 202 proceeds from step 8.36 to step 8.38.

In step 8.34 the processor 202 determines whether the input is connected to a hop. When the processor 202 determines that the input is connected to a hop, the processor 202 proceeds from step 8.34 to step 8.40 to connect the input to the source before the hop. The processor 202 proceeds from step 8.40 to step 8.42. In the alternative, when the processor 202 determines that the input is not connected to a hop, the processor 202 proceeds from step 8.34 to step 8.28.

In step 8.42 the processor 202 determines whether the hop has one or more remaining users. When the processor 202 determines that the hop has at least one remaining user, the processor 202 proceeds from step 8.42 to step 8.34. In the alternative, when the processor 202 determines that the hop does not have remaining users, the processor 202 proceeds from step 8.42 to step 8.44 to destroy the hop. The processor 202 proceeds from step 8.44 to step 8.34.

In step 8.48 the processor 202 determines whether the cell is empty. When the processor 202 determines that the cell is empty, the processor 202 proceeds from step 8.48 to step 8.50 to destroy the cell. The processor 202 proceeds from step 8.50 to step 8.02. In the alternative, when the processor 202 determines that the cell is not empty, the processor 202 proceeds from step 8.48 to step 8.02.

Figure 9:
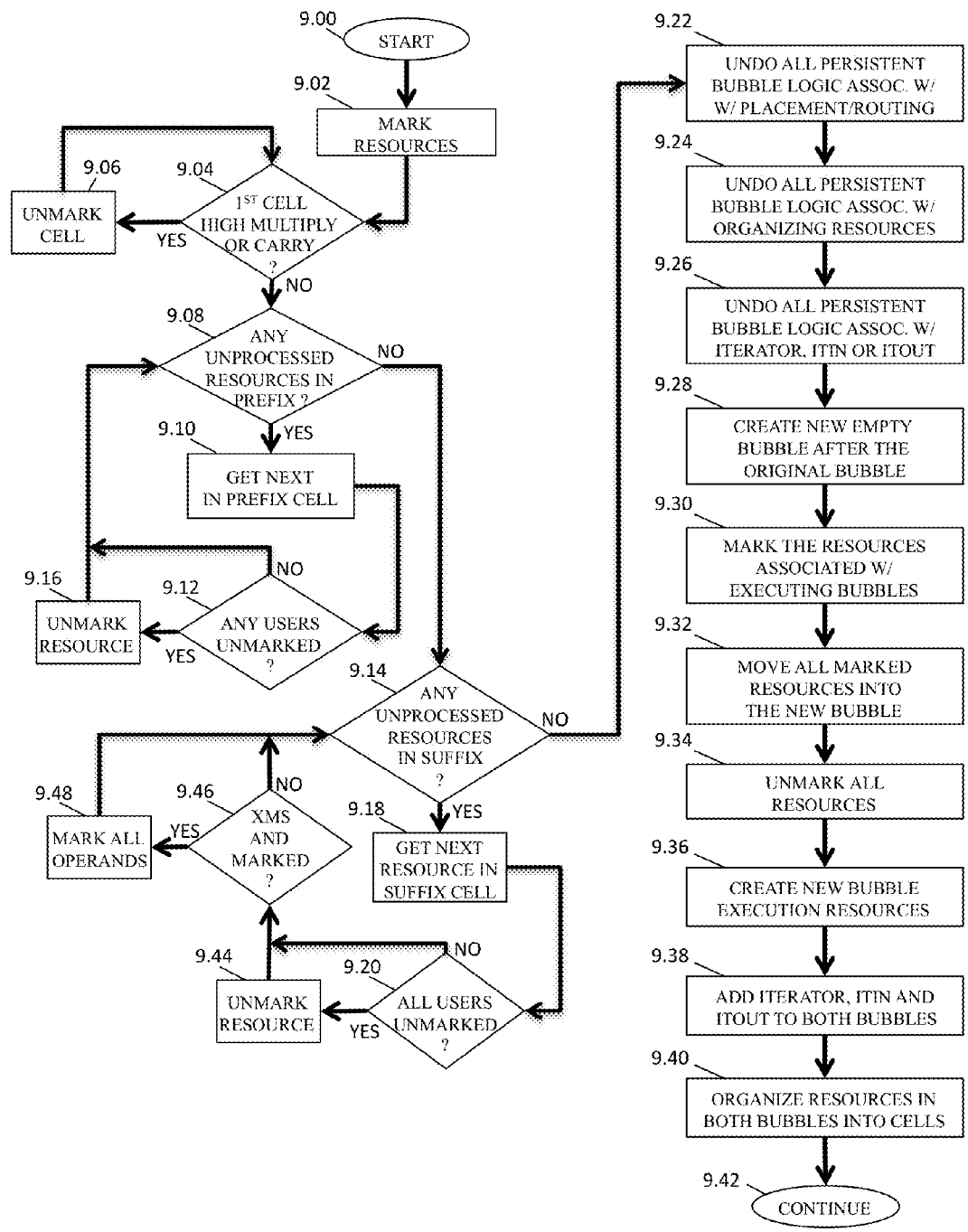
FIG. 9 is a flow chart of additional steps of a splitting the bubble process of the invented compilers of FIG. 2 and FIG. 3.

Referring now generally to the Figures and particularly to FIG. 9, FIG. 9 presents a flow chart of the processor's "Split The Bubble" function of the invented method. In step 9.02 the processor marks the resources in the last half of the cells in the bubble. The processor 202 proceeds from step 9.02 to step 8.04.

In step 9.04 the processor 202 determines whether the first marked cell is a high multiply or is using a carry. When the processor 202 determines that the first marked cell is a high multiply or is using a carry, the processor 202 proceeds from step 9.04 to step 9.06 to unmark the cell. The processor 202 proceeds from step 9.06 to step 9.04. In the alternative, when the processor 202 determines that the first marked cell is not a high multiply or does not use a carry, the processor 202 proceeds from step 9.04 to step 9.08.

In step 9.08 the processor 202 determines whether there are one or more unprocessed resources exist in the prefix cell. When the processor 202 determines that at least one unprocessed resource exists in the prefix cell, the processor 202 proceeds from step 9.08 to step 9.10 to get the last unprocessed resource in a prefix cell. The processor 202 proceeds from step 9.10 to step 9.12. In the alternative, when the processor 202 determines that there are no unprocessed resources existing in prefix cell, the processor 202 proceeds from step 9.08 to step 9.14.

In step 9.12 the processor 202 determines whether one or more of the resource's users are unmarked. When the processor 202 determines that at least one of the resource's users are unmarked, the processor 202 proceeds from step 9.12 to step 9.16 to unmark the resource. The processor 202 proceeds from step 9.16 to step 9.08. In the alternative, when the processor 202 determines that none of the resource's users are unmarked, the processor 202 proceeds from step 9.12 to step 9.08.

In step 9.14 the processor 202 determines whether one or more unprocessed resources exist in the suffix cell. When the processor 202 determines that at least one unprocessed resource exists in the suffix cell, the processor 202 proceeds from step 9.14 to step 9.18 to get the next unprocessed resource in a suffix cell. The processor 202 proceeds from step 9.18 to step 9.20. In the alternative, when the processor 202 determines that there are no unprocessed resources existing in the suffix cell, the processor 202 proceeds from step 9.14 to step 9.22 to undo all persistent bubble logic associated with placement and routing. The processor 202 proceeds from step 9.22 to step 9.24 to undo all persistent bubble logic associated with organizing resources into cells. The processor 202 proceeds from step 9.24 to step 9.24 to undo all persistent bubble logic associated with adding iterator, itin, or itout resources to bubbles. The processor 202 proceeds from step 9.26 to step 9.28 to create a new empty bubble after the original bubble. The processor 202 proceeds from step 9.28 to step 9.30 to mark the resources associated with executing subsequent bubbles. The processor 202 proceeds from step 9.30 to step 9.32 to move all marked resources into the new bubble. The processor 202 proceeds from step 9.32 to step 9.34 to unmark all resources. The processor 202 proceeds from step 9.34 to step 9.36 to create new bubble execution resources in the original bubble that will cause it to execute the new bubble next. The processor 202 proceeds from step 9.36 to step 9.38 and to add iterator, itin, and itout resources as needed to both bubbles. The processor 202 proceeds from step 9.38 to step 9.40 to organize resources in both bubbles into cells. The processor 202 proceeds from step 9.40 to step 9.42 and is done.

In step 9.20 the processor 202 determines whether there are one or more unmarked users of the unprocessed resource in a suffix cell. When the processor 202 determines that at least one of the resource's users are unmarked, the processor 202 proceeds from step 9.20 to step 9.44 and to unmark the resource. The processor 202 proceeds from step 9.44 to step 9.46. In the alternative, when the processor 202 determines that none of the resource's users are unmarked, the processor 202 proceeds from step 9.20 to step 9.46.

In step 9.46 the processor 202 determines if the resource is the external memory controller and if the resource is marked. When the processor 202 determines that the resource is the external memory controller and the resource is marked, the processor 202 proceeds from step 9.46 to step 9.48 to mark all operands in the resource. The processor 202 proceeds from step 9.48 to step 9.14. In the alternative, when the processor 202 determines that the resource is not the external memory controller and the resource is not marked, the processor 202 proceeds from step 9.46 to step 9.14.

Referring now to FIG. 9 and FIG. 10, the cell placement and routing line lists disclosed therein provide an example of placement and routing of reconfigurable logic elements and signal pathways of the DRP 300. Each cell 0-53 referenced in FIG. 9 and FIG. 10 is a software representation of a hardware logic element 314-441. More particularly, the first cell 0 models the first logic element 314 of the DRP 302 and each succeeding cell 1 through 52 and higher sequentially models a an individual logic element 315 through logic element 441. For example cell 1 models logic element 315, cell 10 models logic element 324, cell 51 models logic element 365, cell 53 models logic element 367, and a cell 100 would model logic element 414.

Each cell place line entry specifies a unique cell number about which the input and output information of that line entry describes and relates to. The syntax and content of each individual cell place line entry of FIG. 9 and FIG. 10 includes individual cell routing and placement information that specifies (a.) a particular cell number as the subject cell; (b.) the cell number from which each input signal of the subject cell will be routed; and (c.) the cell number to which each output signal of the subject cell will be routed.

In addition to the essential listing of inputs source cell numbers and output source cell numbers, each cell pace line entry of FIGS. 9 and 10 further states (a.) the X or Y designation of each referenced input signal received by the subject cell and each output signal generated from the subject cell; and (b.) number of gates found between the subject cell and the cells from which inputs are received and to which outputs of the subject cell are routed.

FIG. 10 is an exemplary initial cell listing LS.I comprising placement and routing information prior to compilation by the invented method. The initial cell listing LS.I specifies the locations of signals that succeeding cells must receive as input signals, but is not organized to insure that the limitations of the bus layout of the logic elements of the DRP 302, as described in FIG. 6A and FIG. 6B, are considered. For example, cell place 22 specifies an input signal to be received from an x output of cell 1. It is understood that cell 1 represents a logic element 1 of the RLU 308, or logic element 314, and that cell 22 represents a twenty second logic element of the RLU 308, or logic element 335. However, as can be seen by FIG. 6A and FIG. 6B, the x output bus of the first logic element 308 does not extend to logic element 335, but does extend to logic elements 336 and 334. The representation of cell 22 receiving an input signal from cell 1 is therefore invalid. It is an object of the invented compiler 220 and the DRP compiler 314 to compile the resultant listing LS.R from the initial listing LI.I and thereby to replace invalid models of cell representations of placement and routing of logic elements present in the initial listing LS.I with valid representations of placement and routing of logic elements of the DRP 302 as expressed in the resultant listing LS.R.

FIG. 11 is an exemplary listing of a resultant cell listing LS.R derived in a compilation by the invented compiler of the initial cell listing LI.I of FIG. 10 by the invented compiler 220 or DRP compiler wherein an improved placement and routing pattern of the RLU 308 is generated. It is understood that the steps of FIGS. 7, 8 & 9 provide an exemplary embodiment of the invented method in application in compiling the initial listing LS.I of FIG. 10 into the resultant listing LS.R of FIG. 11.

In one exemplary aspect of the invented compiler 220 or DRP 314, the signal pathway of the X output of cell 1 of the resultant listing LS.R is routed to cell 21, and the X output of cell 21 of the resultant listing LS.R is routed to cell 22, whereby a signal pathway of the X output of cell 1 to provide an input to cell 22 is validly modeled by the compiled resultant listing LS.R of FIG. 11 in accordance with the logic element signal bus layout design disclosed in FIGS. 6A and 6B.

The following additional four examples of the placement and routing corrections effected by the invented compiler 220 and DRP compiler 314 further illustrate the process of FIGS. 7, 8 and 0 in compiling the initial listing LS.I to generate the resultant listing LS.R.

Cell 28 of the initial listing LS.I is placed to cell 30 of the resultant listing LS.R and a signal path is routed for a Y input of cell 30 of the resultant listing LS.R from cell 5 through 6 and to cell 30.

Cell 32 of the initial listing LS.I is placed at cell 34 of the resultant listing LS.R and the a signal path for a Y input of cell 34 of the resultant listing LS.R is routed in the resultant listing LS.R from cell 2 through cell 10 to cell 34.

Cell 44 of the initial listing LS.I is placed at cell 46 of the resultant listing LS.R and a signal path for a first Y input of cell 46 of the resultant listing LS.R is routed in the resultant listing LS.R from cell 15 through cell 22 and to cell 46; and a signal path for a second Y input of cell 46 of the resultant listing LS.R is routed in the resultant listing LS.R from cell 0 through cell 24 and to cell 46.

Cell 45 of the initial listing LS.I is placed at cell 47 of the resultant listing LS.R and a signal path of an X input of cell 45 of the resultant listing LS.R is defined and routed in the resultant listing LS.R from cell 17 through cell 23 and to cell 47.

The foregoing disclosures and statements are illustrative only of the Present Invention, and are not intended to limit or define the scope of the Present Invention. The above description is intended to be illustrative, and not restrictive. Although the examples given include many specificities, they are intended as illustrative of only certain possible configurations or aspects of the Present Invention. The examples given should only be interpreted as illustrations of some of the preferred configurations or aspects of the Present Invention, and the full scope of the Present Invention should be determined by the appended claims and their legal equivalents. Those skilled in the art will appreciate that various adaptations and modifications of the just-described preferred embodiments can be configured without departing from the scope and spirit of the Present Invention. Therefore, it is to be understood that the Present Invention may be practiced other than as specifically described herein. The scope of the present invention as disclosed and claimed should, therefore, be determined with reference to the knowledge of one skilled in the art and in light of the disclosures presented above.

I claim:
1. A computer-implemented method, comprising:
a. receiving an instruction adapted for execution by a dynamically reconfigurable processor:
b. accessing a software model of the plurality of homogeneous logic elements of a dynamically reconfigurable computer architecture, the software model comprising a plurality of cells and representing the interconnectivity of the plurality of cells, each cell modeling one of the logic elements of the plurality of homogeneous logic elements, wherein a first cell models the first logic element and a second cell models the second logic element:

c. in accordance with the instruction, attempting to route a first notional simulated signal route in the software model from the first cell to the second cell by assigning a first selection of cells of the plurality of cells to the notional signal route:
d. detecting a failure to successfully route in the software model the first notional signal route through the first selection of cells of the plurality of cells from the first cell to the second cell;
e. ripping up all assigned intervening cells until routing to the second cell is possible;
f. leaving a third cell of the reconfigurable logic unit uncommitted at a simulated location within the software model;
g. retrying the placement of the plurality of cells and routing from the most recently ripped up cell at the next available simulated cell location; and
h. sequentially repeating the procedure of steps a through f until a notional signal route is successfully routed in the software model from the first cell to the second cell.

2. The method of claim 1, further comprising:
i. Detection of a failure to route a simulated signal route in the software model from the first cell to the second cell;
j. Ripping up the placement of the first portion of the instruction from placement at the first cell;
k. Simulating placing the first portion of the instruction at a third cell of the software model wherein the third cell models a third logic element of the processor and the connectivity thereof;
l. Simulating placing the second portion of the instruction at a fourth cell of the software model wherein the fourth cell models a fourth logic element of the processor and the connectivity thereof; and
m. Configuring a dynamically reconfigurable processor to route a signal from the third logic element to the fourth logic element.

3. The method of claim 2, further comprising fully placing and routing the instruction within the plurality of heterogeneous components.

4. The method of claim 2, further comprising executing the dynamically reconfigurable processor as reconfigured in accordance with the instruction.

5. The method of claim 1, wherein the plurality of logic elements are modeled by the plurality of cells to be linearly ordered along a single dimension.

6. The method of claim 2, further comprising:
n. Individually and sequentially placing and routing a plurality of portions of the instruction after placing the first portion of the instruction and before placing the second portion of the instruction; and
o. Configuring the dynamically reconfigurable processor to route a signal from the first logic element to the second logic element.

7. The method of claim 6, wherein the plurality of logic elements are linearly ordered along a single dimension.

8. The method of claim 1, further comprising:
i. Placing the first portion of the instruction at a third logic element;
j. Individually and sequentially placing and routing a plurality of portions of the instruction at a plurality of logic elements after placing the first portion of the instruction and before placing the second portion of the instruction at a fourth logic element;
k. Configuring the processor to route a signal pathway from the third logic element to the fourth logic element; and
l. Directing a dynamically reconfigurable processor to execute the instruction.

9. The method of claim 8, further comprising determining that the signal pathway between the third logic element and the fourth logic element is valid by software simulation prior to configuring the processor and executing the instruction.

10. The method of claim 8, further comprising fully placing and routing the instruction within the plurality of heterogeneous components.

11. The method of claim 9, further comprising executing the processor in accordance with the instruction.

12. The method of claim 2, wherein at least one portion of the plurality of portions of the instruction is placed at at least two logic elements prior to the processor executing the instruction.

13. The method of claim 2, wherein at least two portions of the plurality of instruction portions are placed at a same logic element.

14. The method of claim 2, wherein at least one logic element provides a hop between two other logic elements when the processor is configured in accordance with the instruction.

15. The method of claim 2, wherein the at least one logic element is additionally comprised within a placement of an alternate portion of the instruction.

16. A method comprising:
a. providing a dynamically reconfigurable processor ("the processor") comprising a reconfigurable logic unit comprising a plurality of logic elements, and the processor further comprising a system memory coupled with the reconfigurable logic unit, an instruction pipe coupled with the reconfigurable logic unit, and an instruction bus coupled with both the instruction pipe and the system memory;
b. placing a plurality of portions of an instruction stored in the system memory by a first reconfiguration of the processor via the instruction bus and the instruction pipe;
c. attempting to configure the processor to establish a sequential signal pathway through the plurality of portions of the instruction;
d. determining by software simulation that the signal pathway does not provide a first signal route from a first placement of a first portion of the instruction to a later placement of a later portion of the instruction;
e. ripping up the placement of the signal pathway by software simulation from the later placement to the first placement;
f. placing a plurality of portions of the instruction by software simulation in a simulated alternate reconfiguration of the processor;
g. attempting to configure the processor in software simulation to establish an alternate sequential signal pathway through the plurality of portions of the instruction;
h. determining by software simulation that the signal pathway does provide a second signal route from a first placement of a first portion of the instruction to a later placement of a later portion of the instruction; and
i. directing the processor to execute the instruction in accordance with the software simulation.

17. A dynamically reconfigurable processor comprising:
a. an instruction bus;
b. an instruction pipe coupled with the instruction bus;
c. a reconfigurable logic unit coupled with the instruction pipe;
d. a data pipe coupled with the reconfigurable logic unit;

e. a data bus coupled with the data pipe;
f. the reconfigurable logic unit comprising a plurality of homogeneous logic elements, each logic element comprising a substantively similar plurality of heterogeneous components;
g. means to reconfigure the plurality of homogeneous logic elements in accordance with an instruction;
h. means to place a first portion of the instruction at a first logic element;
i. means to place a second portion of the instruction at a second logic element;
j. means to detect a failure to configure a signal route from the first logic element to the second logic element;
k. means to rip up the placement of the first portion of the instruction from placement at the first logic element;
l. means to place the first portion of an instruction at a third logic element;
m. means to place the second portion of the instruction at a fourth logic element;
n. means to route a signal from the third logic element to the fourth logic element; and
o. means to execute the configured processor in accordance with the instruction.

* * * * *